United States Patent

Nawaz et al.

(10) Patent No.: US 10,315,912 B2
(45) Date of Patent: Jun. 11, 2019

(54) MICROELECTROMECHANICAL SYSTEM MICROPHONE

(71) Applicant: Knowles Electronics, LLC, Itasca, IL (US)

(72) Inventors: Mohsin Nawaz, Itasca, IL (US); Michael Kuntzman, Chicago, IL (US); Michael Pedersen, Ashton, MD (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 15/853,401

(22) Filed: Dec. 22, 2017

(65) Prior Publication Data

US 2018/0194615 A1    Jul. 12, 2018

Related U.S. Application Data

(60) Provisional application No. 62/439,803, filed on Dec. 28, 2016.

(51) Int. Cl.
- *B81B 3/00* (2006.01)
- *B81B 7/00* (2006.01)
- *H04R 19/00* (2006.01)

(52) U.S. Cl.
CPC .......... *B81B 3/0027* (2013.01); *B81B 7/0032* (2013.01); *B81B 7/0035* (2013.01); *H04R 19/005* (2013.01); *B81B 2201/0257* (2013.01); *B81B 2203/0127* (2013.01); *B81B 2203/0136* (2013.01); *B81B 2203/053* (2013.01); *H04R 2410/00* (2013.01)

(58) Field of Classification Search
CPC ............... H04R 19/005; H04R 2410/00; B81B 2201/0257; B81B 3/0027; B81B 7/0032; B81B 7/0035; B81B 2203/0127; B81B 2203/0136; B81B 2203/053

See application file for complete search history.

(56) References Cited

U.S. PATENT DOCUMENTS

| 7,190,038 B2 | 3/2007 | Dehe et al. |
| 7,473,572 B2 | 1/2009 | Dehe et al. |

(Continued)

FOREIGN PATENT DOCUMENTS

| CN | 105992113 A | 10/2016 |
| EP | 2 866 469 A2 | 4/2015 |
| JP | 2008-259061 A1 | 10/2008 |

OTHER PUBLICATIONS

International Search Report and Written Opinion, PCT/US2017/068324, Knowles Electronics, LLC, 14 pages (dated Mar. 21, 2018).

*Primary Examiner* — Scott B Geyer
(74) *Attorney, Agent, or Firm* — Foley & Lardner LLP

(57) ABSTRACT

A microelectromechanical system (MEMS) includes a diaphragm with a first surface and a second surface. The first surface is exposed to an environmental pressure. The second surface comprises a plurality of fingers extending from the second surface. The MEMS also includes a backplate comprising a plurality of voids. Each of the plurality of fingers extends into a respective one of the plurality of voids. The MEMS further includes an insulator between a portion of the diaphragm and a portion of the backplate. The diaphragm is configured to move with respect to the backplate in response to changes in the environmental pressure.

20 Claims, 24 Drawing Sheets

(56) References Cited

U.S. PATENT DOCUMENTS

| | | |
|---|---|---|
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,889,030 B2 | 2/2011 | Schoen et al. |
| 7,903,831 B2 | 3/2011 | Song |
| 8,040,207 B2 | 10/2011 | Winkler et al. |
| 8,115,573 B2 | 2/2012 | Schoen et al. |
| 8,461,655 B2 | 6/2013 | Klein et al. |
| 9,031,266 B2 | 5/2015 | Dehe et al. |
| 9,131,319 B2 | 9/2015 | Zoellin et al. |
| 9,728,653 B2 | 8/2017 | Dehe et al. |
| 2005/0207605 A1 | 9/2005 | Dehe et al. |
| 2007/0278501 A1 | 12/2007 | MacPherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2009/0278216 A1 | 11/2009 | Nakatani |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2015/0001647 A1* | 1/2015 | Dehe ............... B81B 3/0021 257/416 |
| 2015/0110309 A1* | 4/2015 | Park ............... H04R 19/005 381/190 |
| 2015/0304777 A1* | 10/2015 | Xu ............... H04R 1/326 381/58 |
| 2016/0066099 A1 | 3/2016 | Dehe et al. |
| 2017/0297895 A1 | 10/2017 | Kautzsch et al. |
| 2018/0317022 A1 | 11/2018 | Evans et al. |

\* cited by examiner

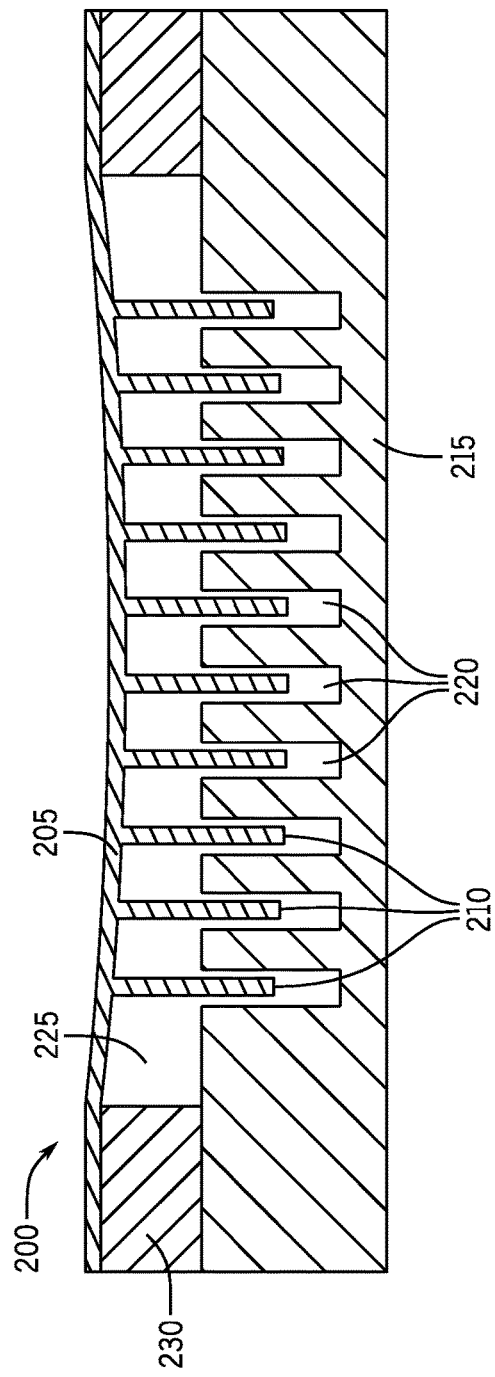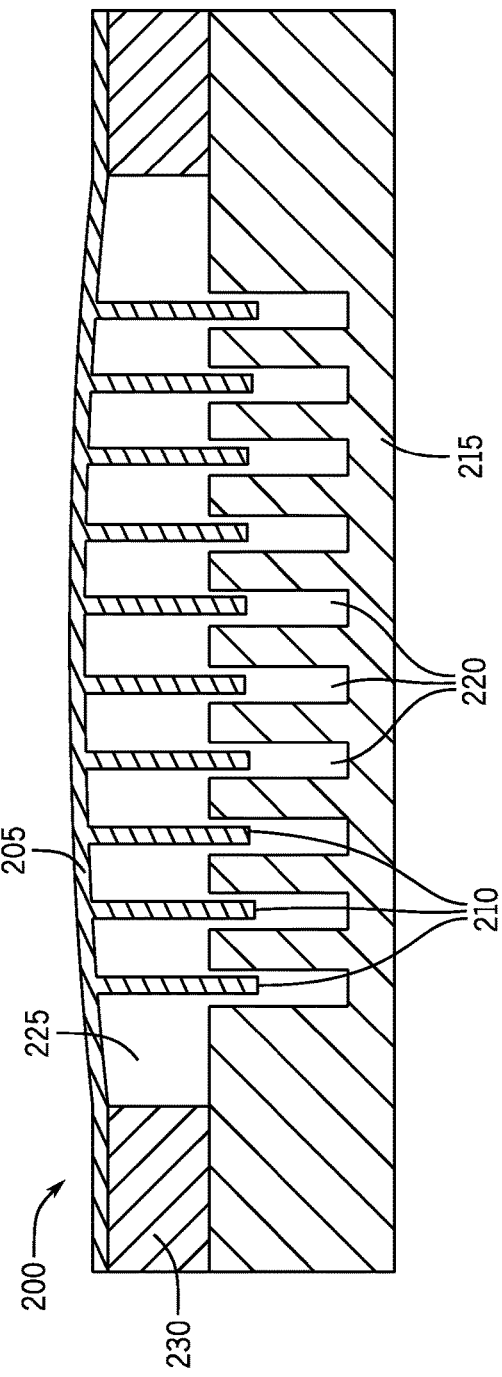

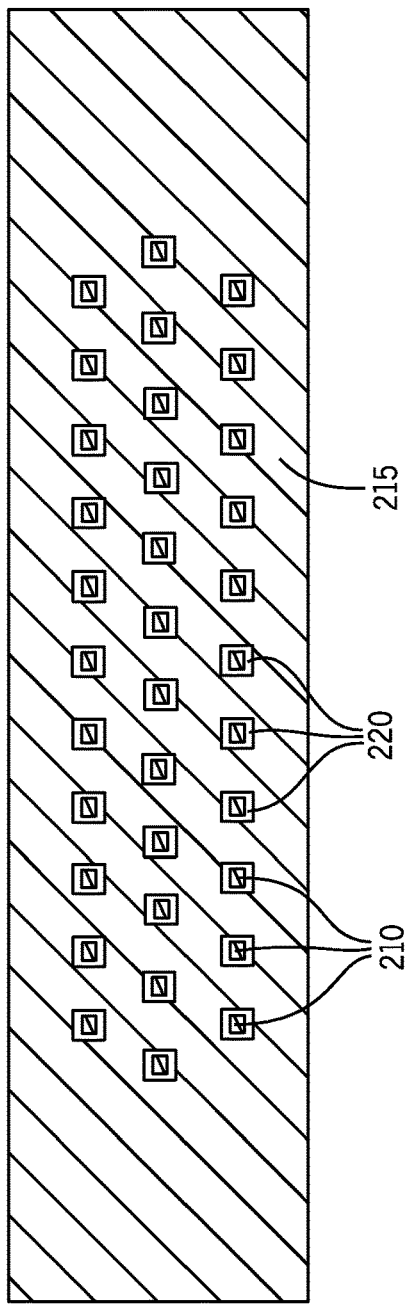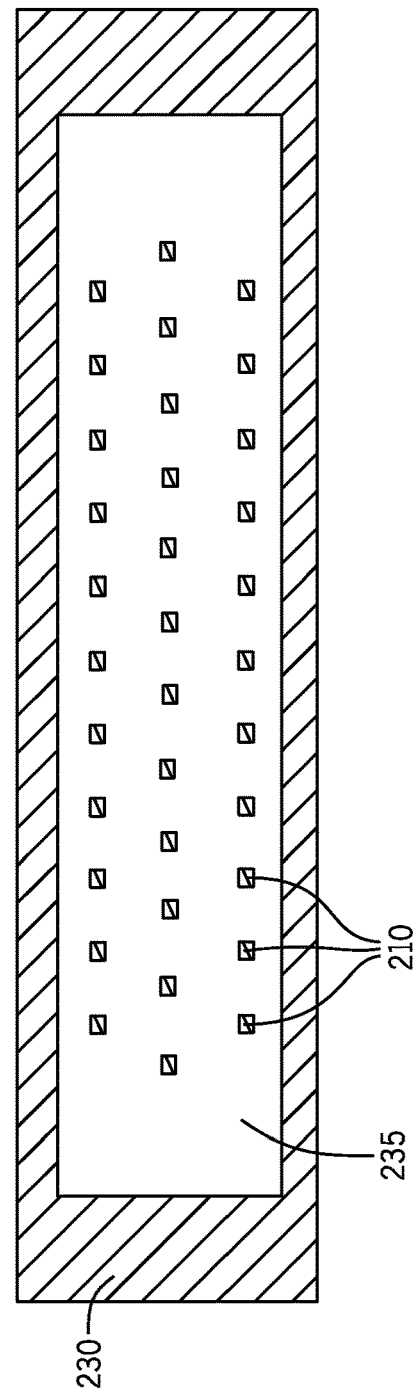

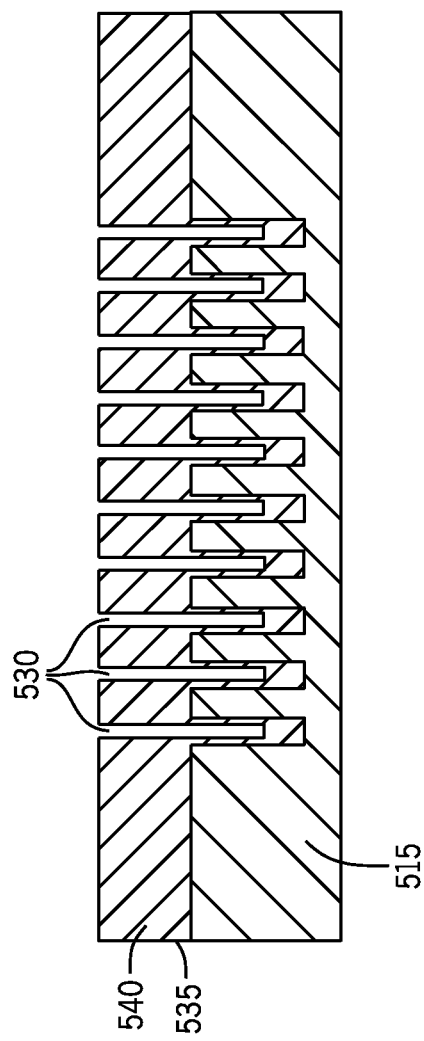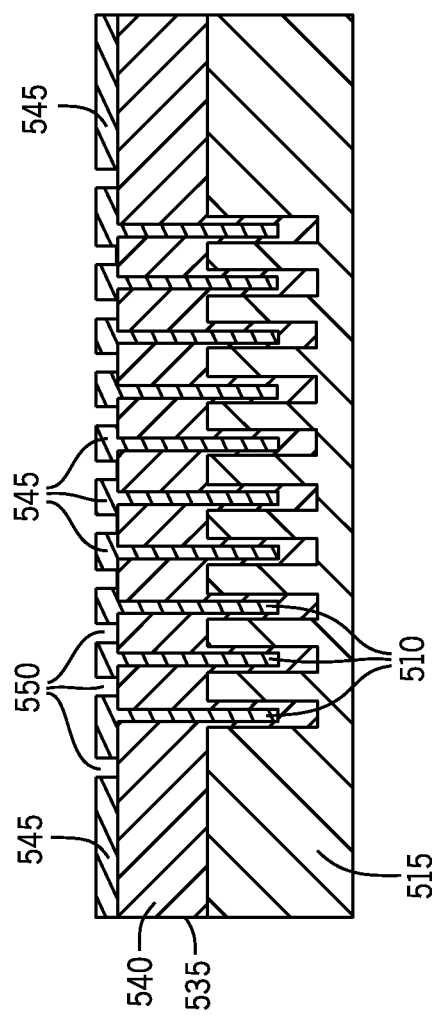

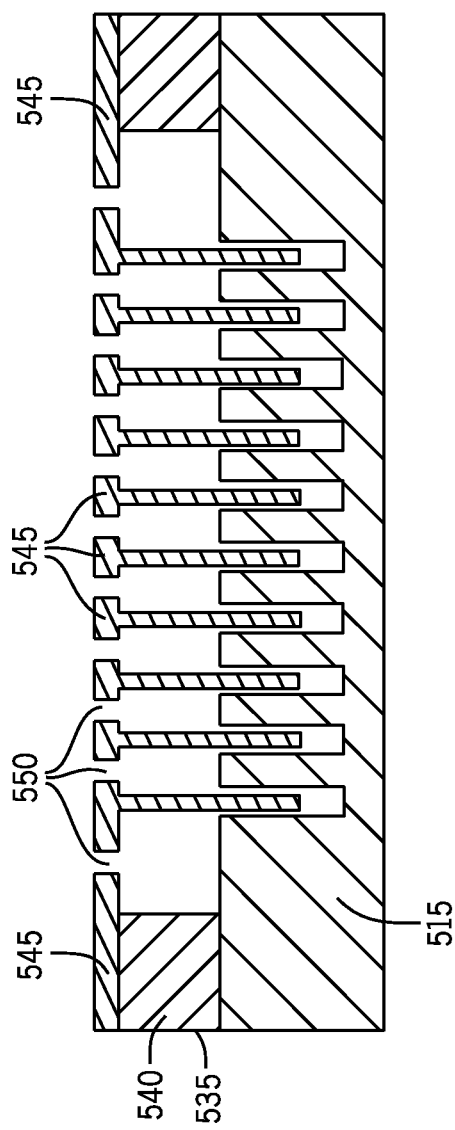
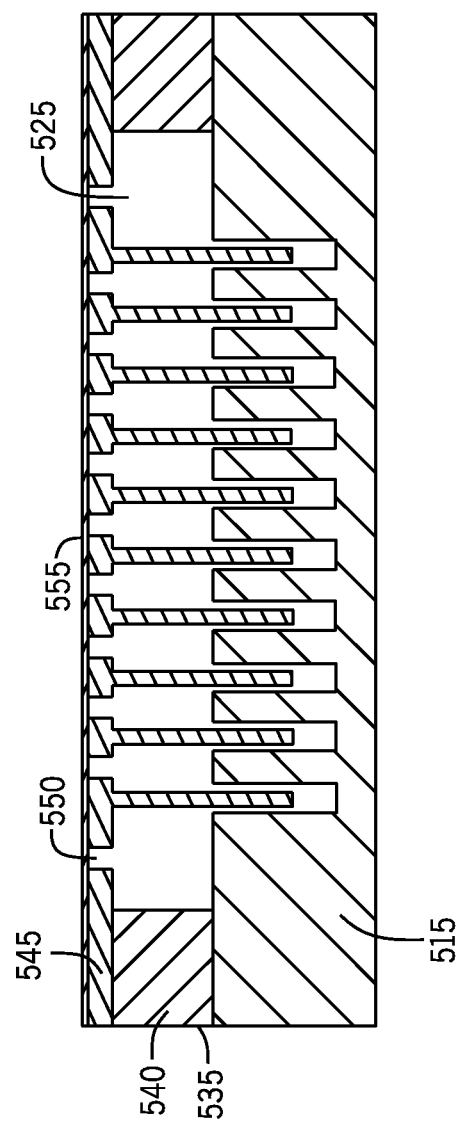

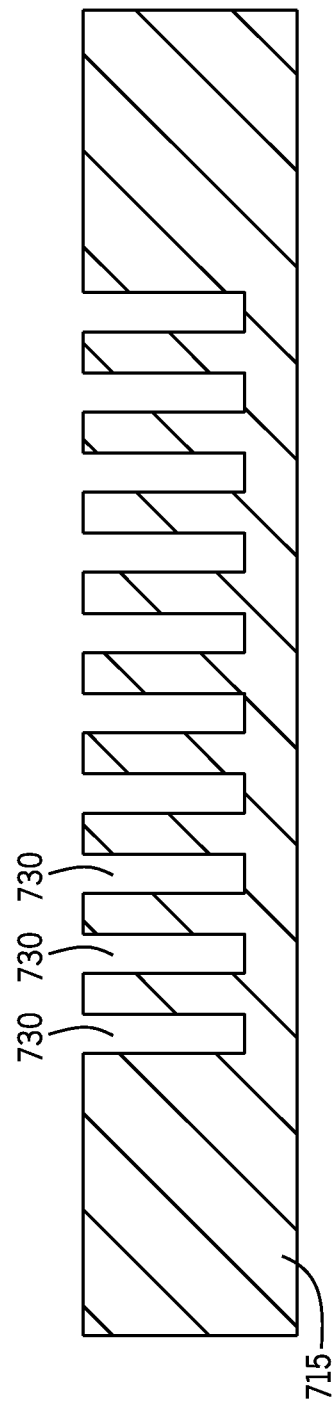
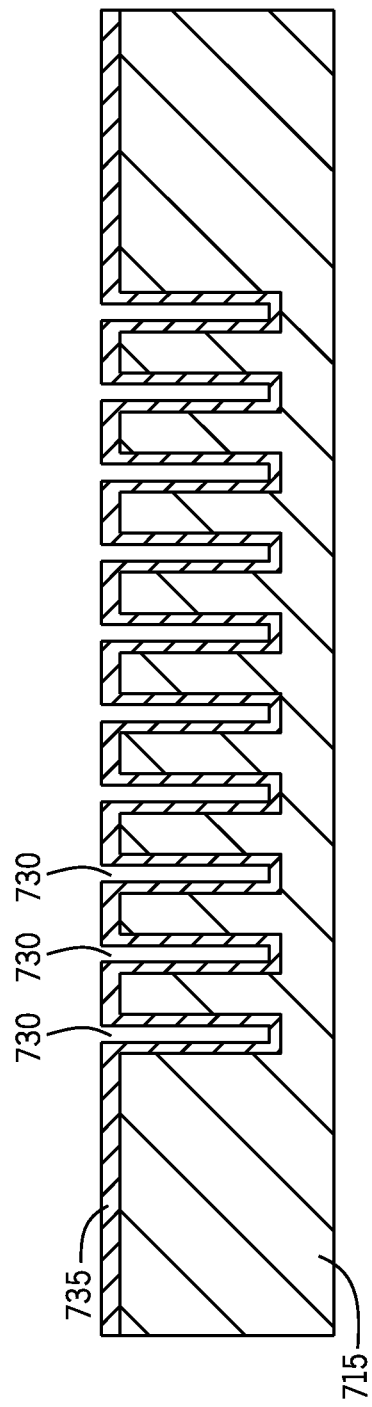

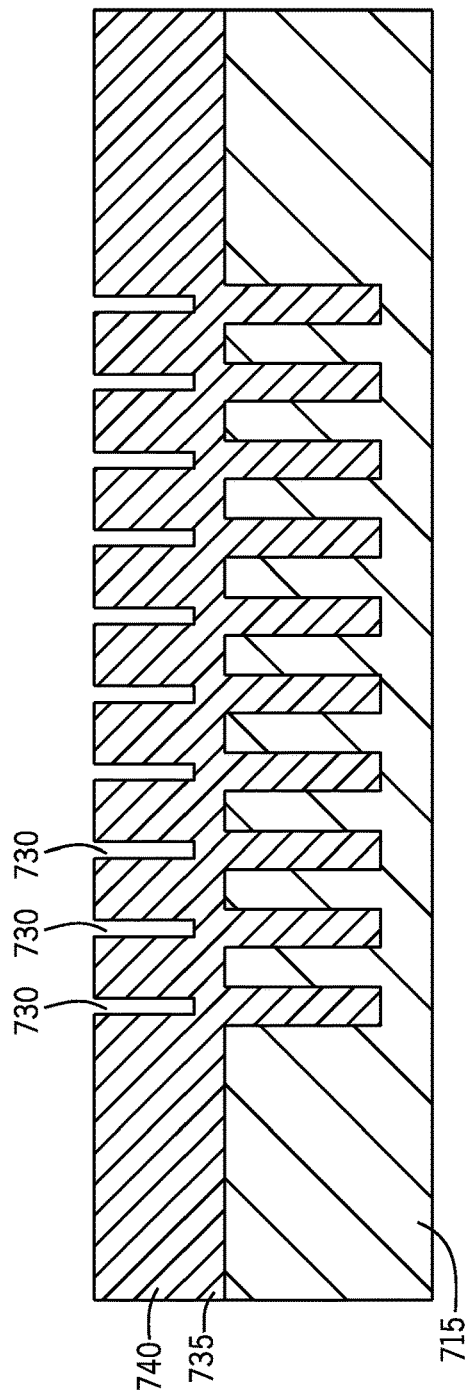
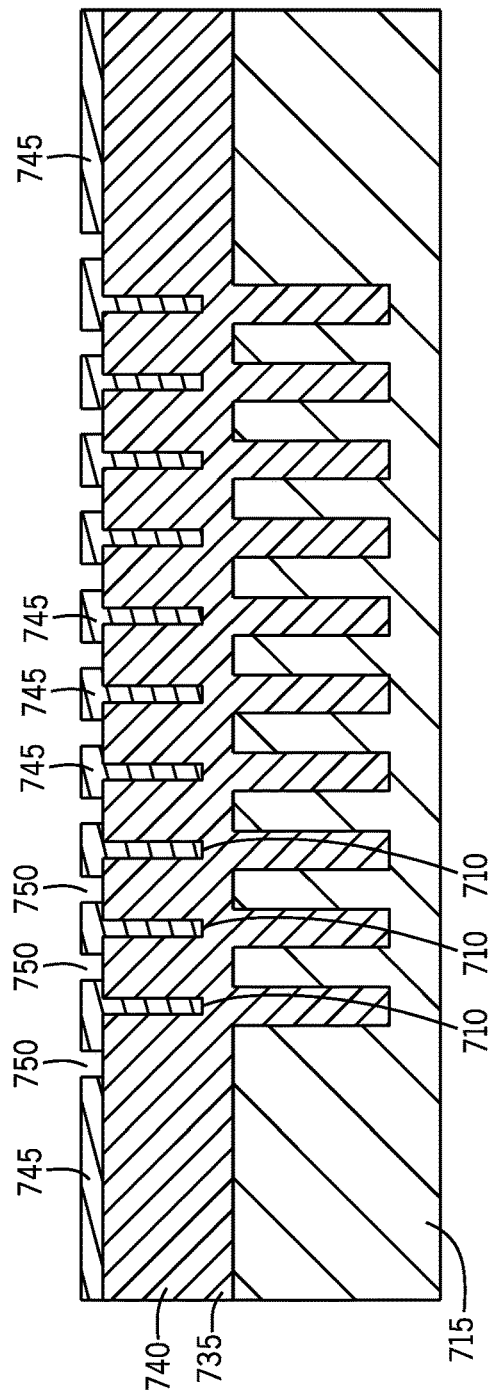
FIG. 7C
FIG. 7D

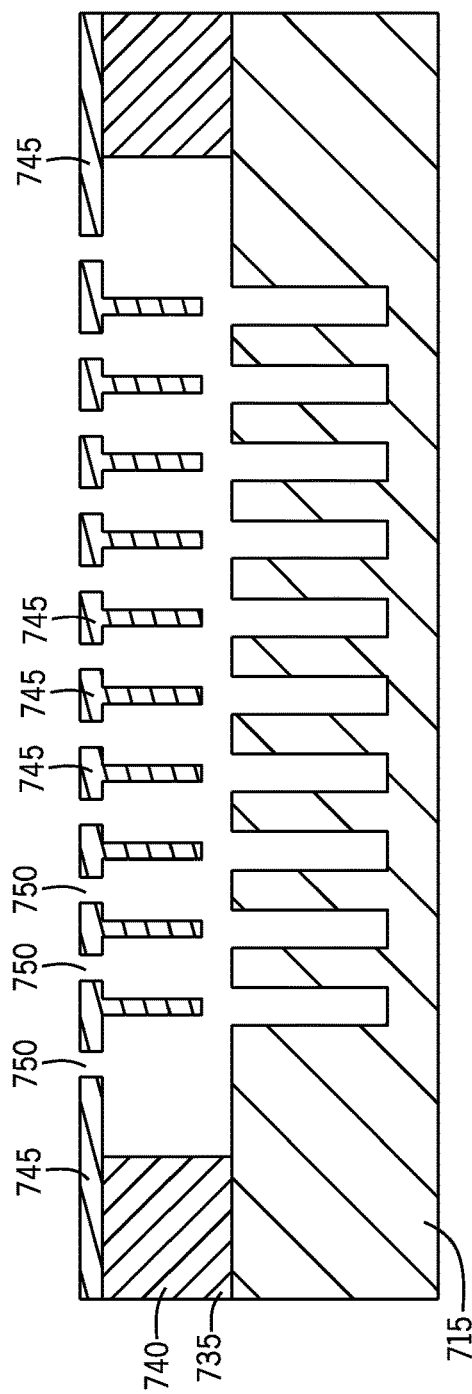
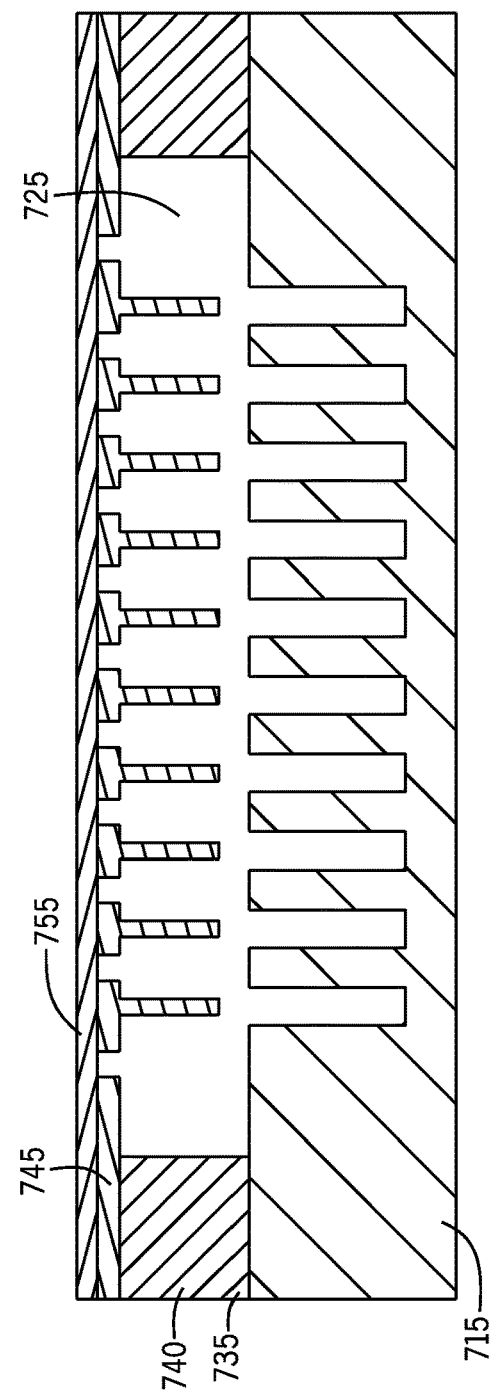

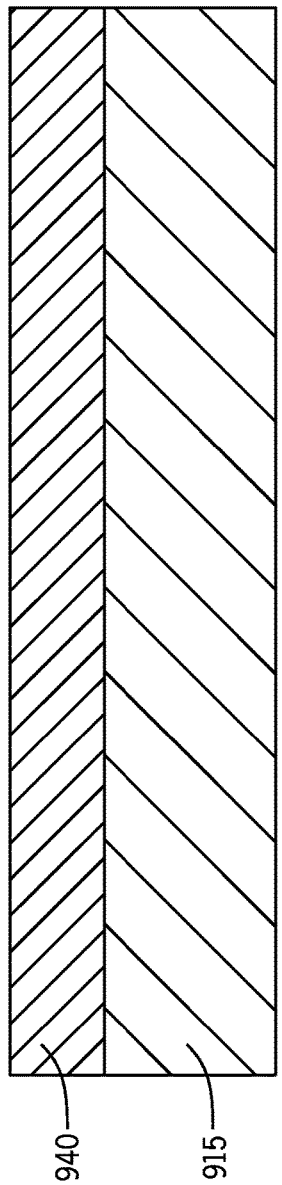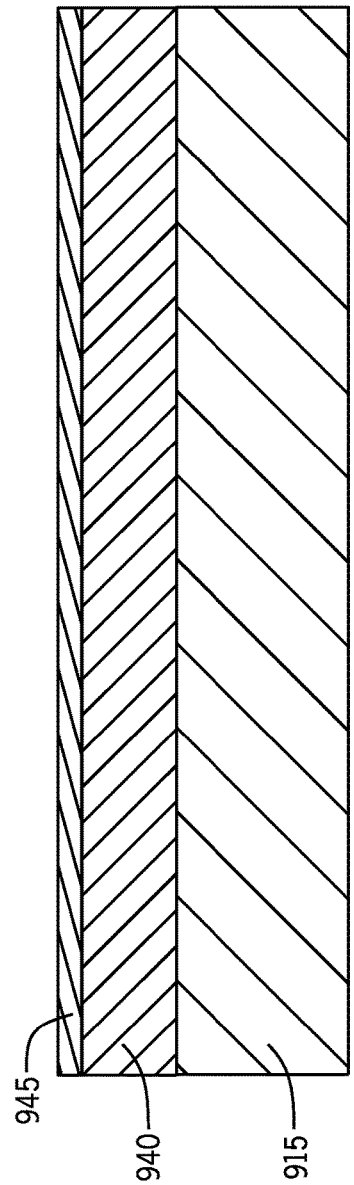

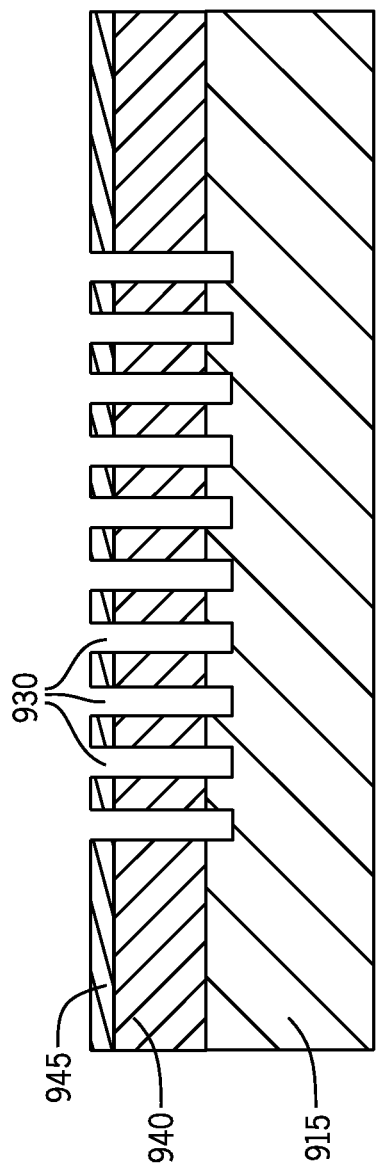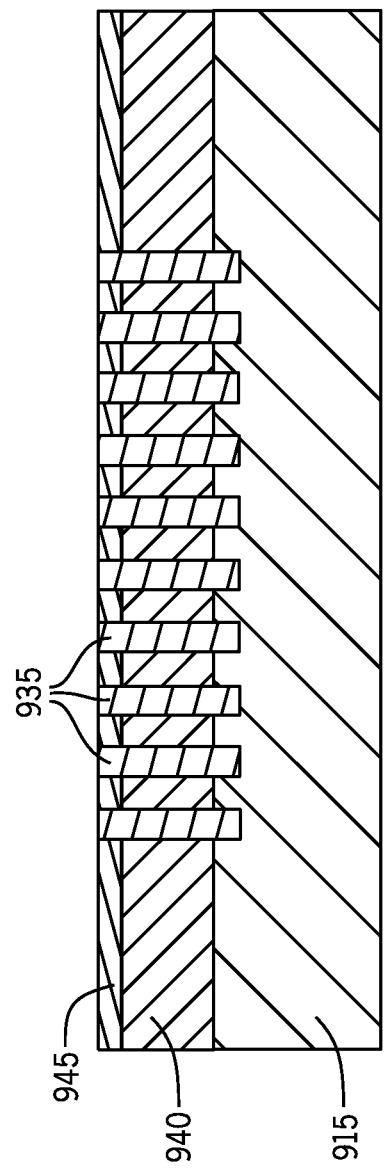

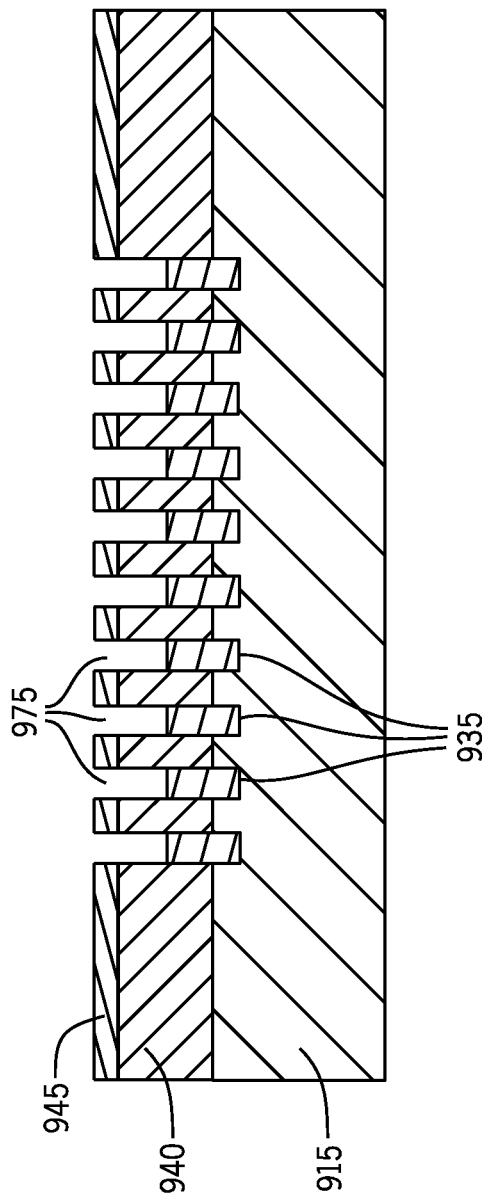
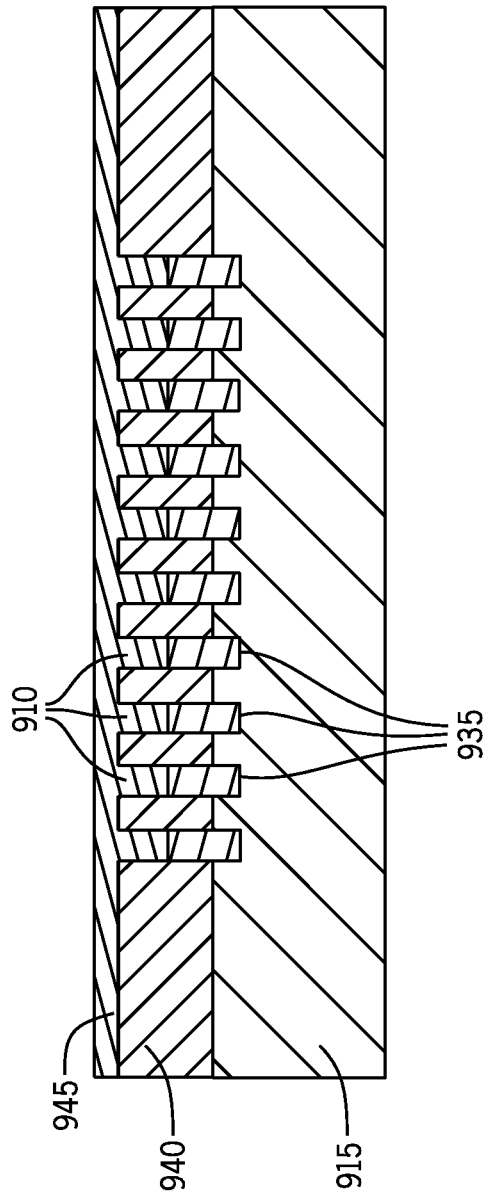

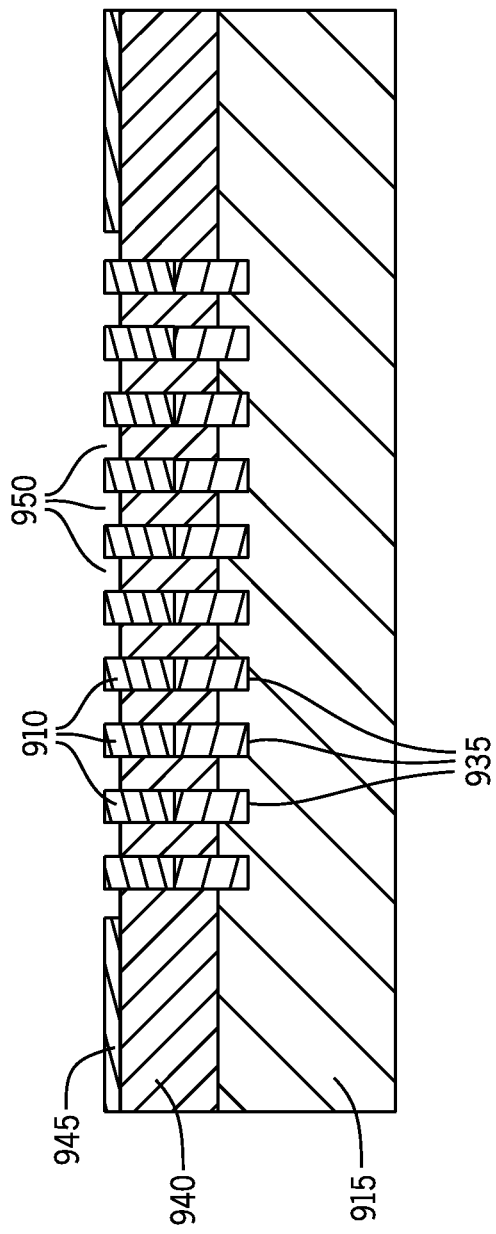
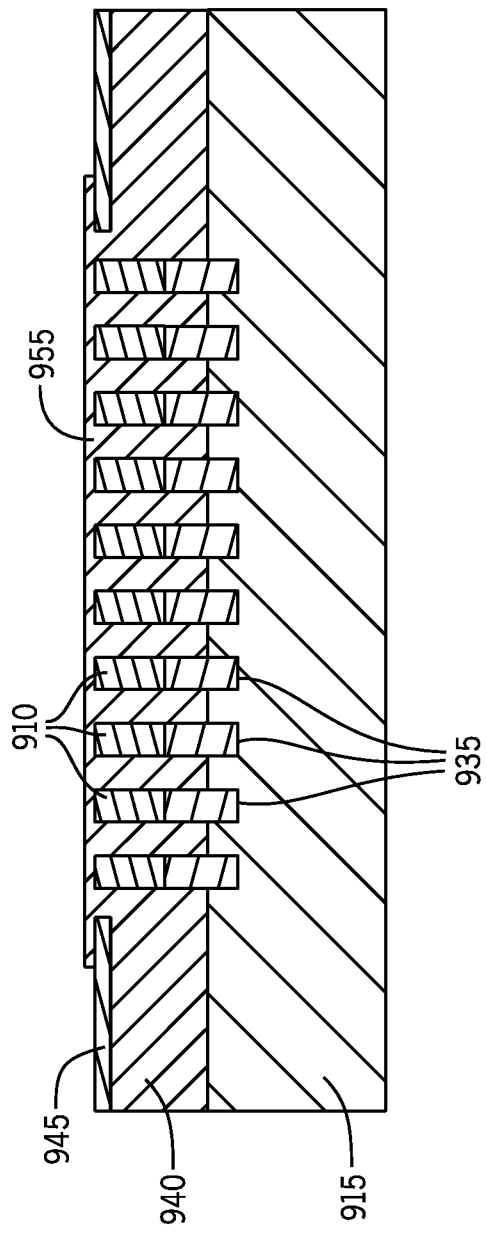

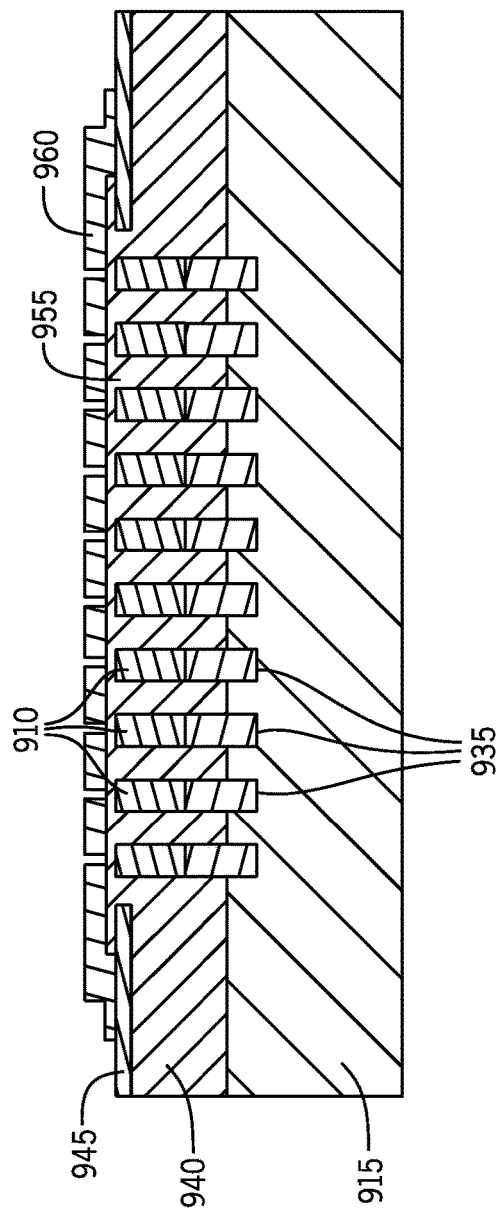
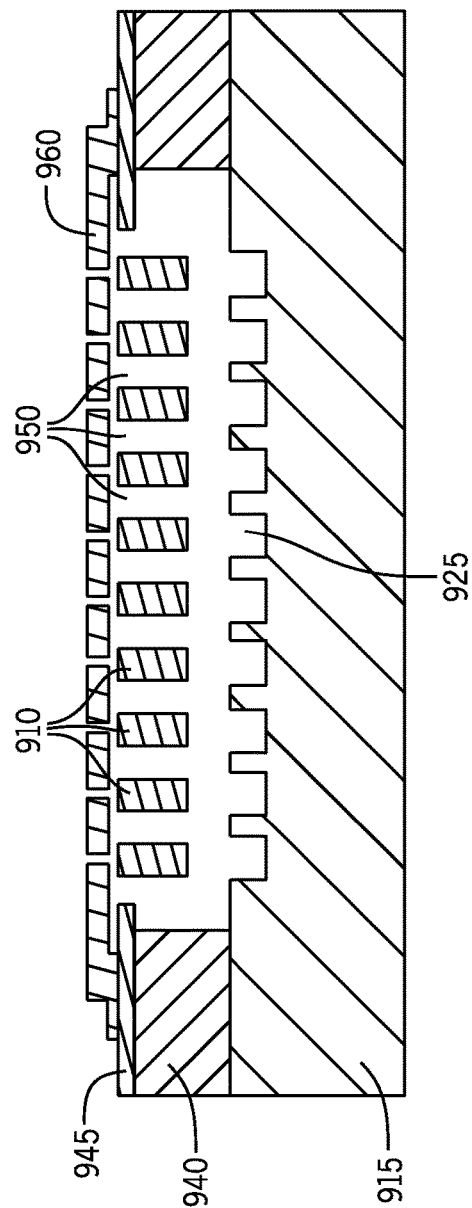

MICROELECTROMECHANICAL SYSTEM MICROPHONE

CROSS-REFERENCE TO RELATED APPLICATIONS

This application claims the benefit of and priority to U.S. Provisional Patent Application No. 62/439,803, filed Dec. 28, 2016, the entire contents of which are incorporated herein by reference.

BACKGROUND

The following description is provided to assist the understanding of the reader. None of the information provided or references cited is admitted to be prior art.

Microelectromechanical systems (MEMS) are used in electronics such as smartphones and tablets. MEMS microphones can convert acoustic energy into an electrical signal. In general, as traditional MEMS microphones get smaller, the quality of the MEMS microphones decreases. However, space within devices that use MEMS microphones is minimal, and the quality of the MEMS microphones requested by consumers and/or device manufacturers is increasing.

SUMMARY

In general, one aspect of the subject matter described in this specification can be embodied in an apparatus for transducing acoustic energy into electrical signals. An illustrative microelectromechanical system (MEMS) includes a diaphragm with a first surface and a second surface. The first surface is exposed to an environmental pressure. The second surface comprises a plurality of fingers extending from the second surface. The MEMS also includes a backplate comprising a plurality of voids. Each of the plurality of fingers extends into a respective one of the plurality of voids. The MEMS further includes an insulator between a portion of the diaphragm and a portion of the backplate. The diaphragm is configured to move with respect to the backplate in response to changes in the environmental pressure.

An illustrative system includes a microelectromechanical system (MEMS) and a processing circuit. The MEMS includes a diaphragm with a first surface and a second surface. The first surface is exposed to an environmental pressure. The second surface comprises a plurality of fingers extending from the second surface. The MEMS also includes a backplate comprising a plurality of voids. Each of the plurality of fingers extends into a respective one of the plurality of voids. The MEMS further includes an insulator between a portion of the diaphragm and a portion of the backplate. The diaphragm is configured to move with respect to the backplate in response to changes in the environmental pressure. The processing circuit is operatively coupled to the MEMS and is configured to apply a constant voltage across the diaphragm and the insulator and generate an electrical signal based on a capacitance between the diaphragm and the backplate. The electrical signal is representative of the changes in the environmental pressure.

An illustrative method of manufacturing a microelectromechanical system (MEMS) element includes forming voids into a substrate and applying a conformal coating onto a surface of the substrate that comprises the voids. The method also includes applying a non-conformal coating onto at least a portion of the conformal coating and applying a conductive layer onto the non-conformal coating. The conductive layer comprises fingers that each correspond to one of the voids. The method further includes removing an inner portion of the conformal coating and the non-conformal coating such that the fingers are not attached to the respective one of the voids. The method also includes applying a cover layer on top of the conductive layer thereby sealing an inside volume that is defined, at least in part, by the substrate, the non-conformal coating, and the cover layer.

An illustrative method of manufacturing a microelectromechanical systems (MEMS) element includes depositing a conformal coating over a substrate and depositing a first conductive layer over the conformal coating. The method also includes forming first trenches through the first conductive layer, the conformal coating, and a portion of the substrate. The method further includes filling the first trenches. The first trenches are filled with a material that is flush with a top surface of the first conductive layer. The method also includes forming second trenches through the first conductive layer and a portion of the material that fills the second trenches. The method also includes forming fingers that extend from the first conductive layer by filling the second trenches with a conductive material and removing material from a volume between the first conductive layer and the substrate.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIGS. 2A-2C are cross-sectional diagrams of a low-pressure MEMS acoustic element in accordance with an illustrative embodiment.

FIG. 3 is a cross-sectional diagram of a low-pressure MEMS acoustic element along line 299 of FIG. 2A in accordance with an illustrative embodiment.

FIG. 4 is a cross-sectional diagram of a low-pressure MEMS acoustic element along line 298 of FIG. 2A in accordance with an illustrative embodiment.

FIGS. 5A-5F are diagrams illustrating a method of producing a low-pressure MEMS acoustic element in accordance with an illustrative embodiment.

FIGS. 7A-7G are diagrams illustrating a method of producing a low-pressure MEMS acoustic element in accordance with an illustrative embodiment.

FIGS. 9A-9L are diagrams illustrating a method of producing a low-pressure MEMS acoustic element in accordance with an illustrative embodiment.

Figure 1A:
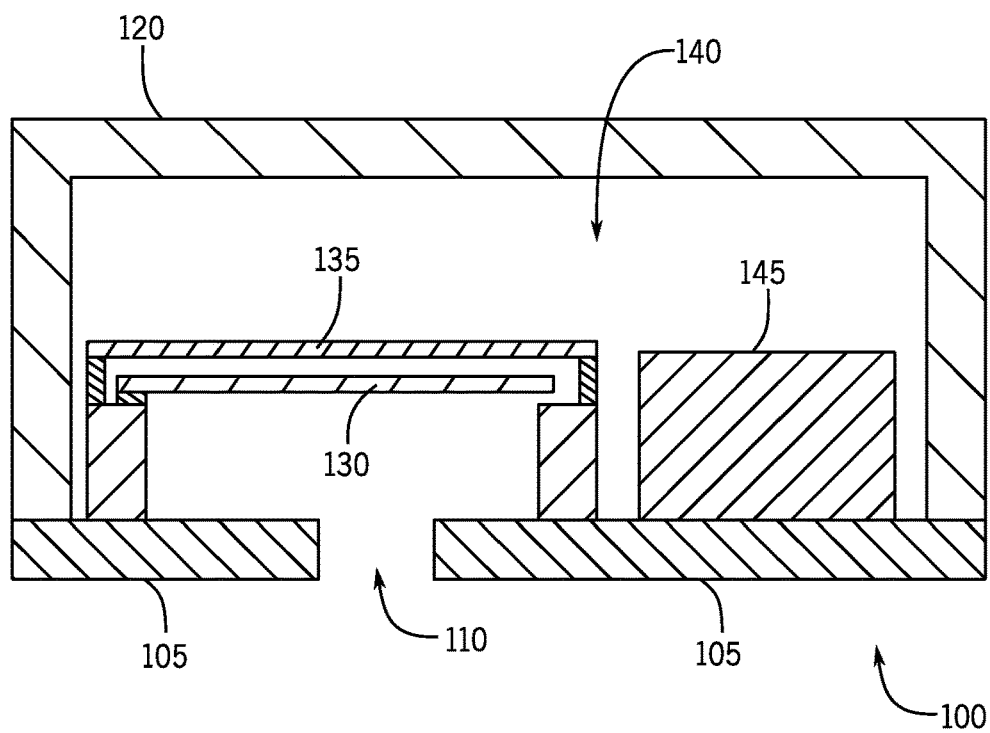
FIGS. 1A-1C are cross-sectional diagrams of traditional MEMS acoustic microphones.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

Figure 1B:
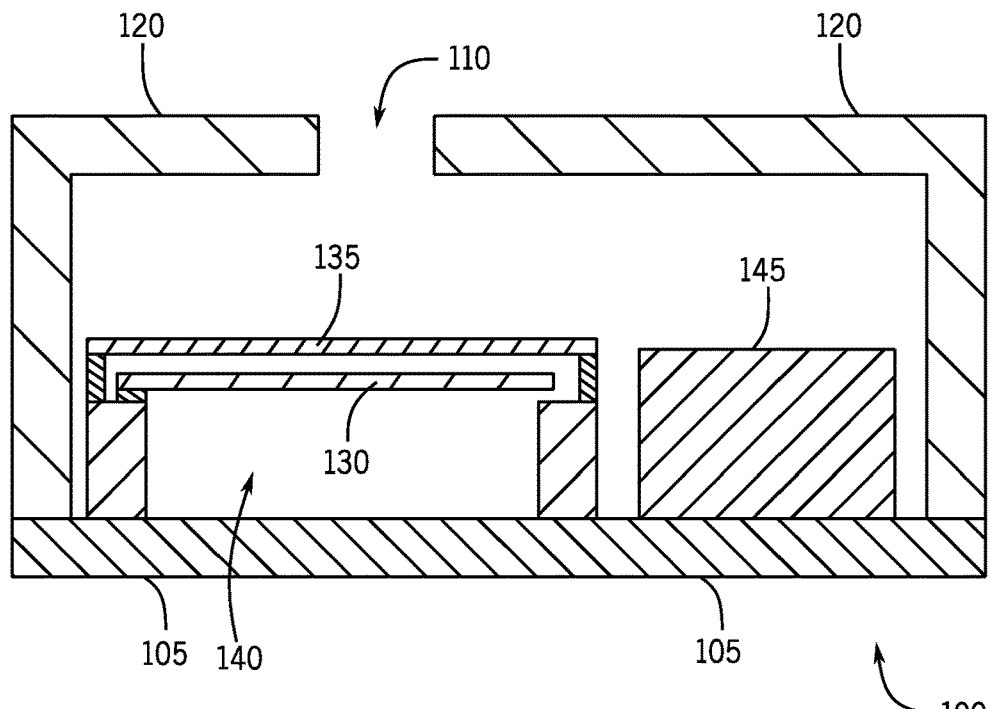
Figure 1C:
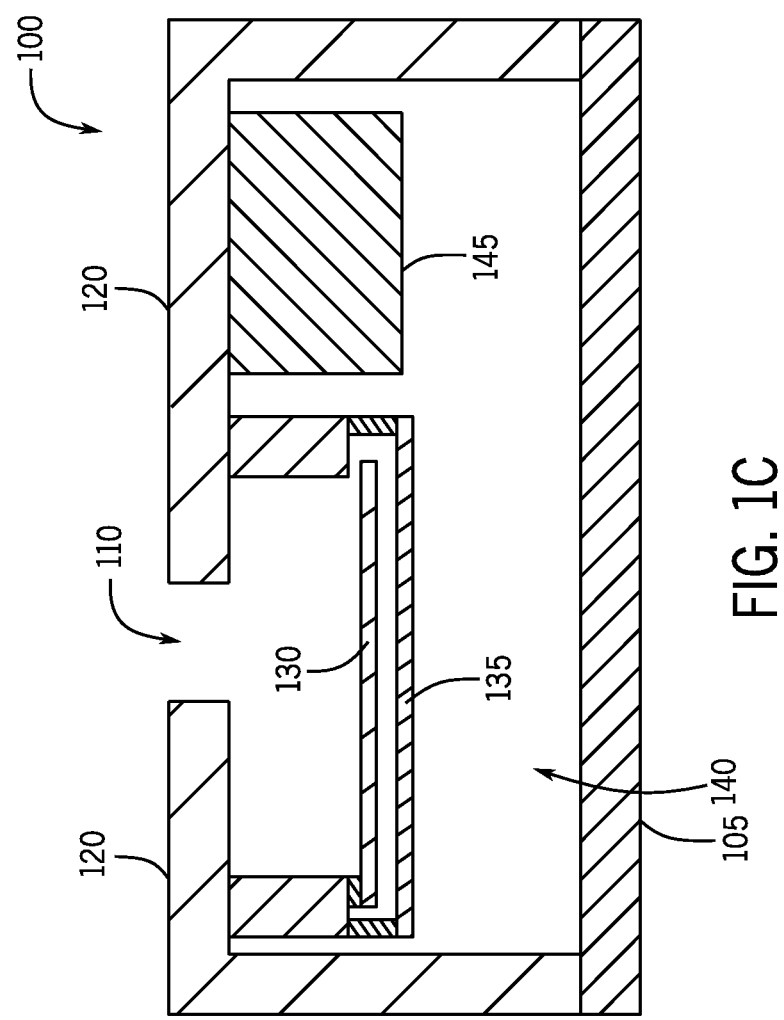

Microelectromechanical system (MEMS) acoustic microphones are used to convert acoustic signals (e.g., changes in air pressure) into electrical signals. FIGS. 1A-1C are cross-sectional diagrams of traditional MEMS acoustic microphones. In each of FIGS. 1A-1C, the MEMS microphone 100 includes a base 105, an acoustic port 110 in the base 105, a diaphragm 130, a backplate 135, an application-specific integrated circuit (ASIC) 145, and a cover 120. FIG. 1A is a cross-sectional diagram of a bottom-port version of the MEMS microphone 100, FIG. 1B is a cross-sectional diagram of a top-port version of the MEMS microphone 100, and FIG. 1C is a cross-sectional diagram of a MEMS-on-lid version of the MEMS microphone 100. In alternative embodiments, any suitable style can be used.

With respect to FIG. 1A, as acoustic energy enters the acoustic port 110, the diaphragm 130 moves with respect to the backplate 135, which is fixed. The capacitance between the diaphragm 130 and the backplate 135 is used as an electrical signal indicative of the acoustic energy. The ASIC 145 processes the electrical signal from the MEMS motor (e.g. the diaphragm 130 and the backplate 135) to provide an electrical signal (e.g., a digital signal) to another computing device (e.g., a smartphone). In the embodiments illustrated in FIGS. 1B and 1C, the acoustic port 110 is in the cover 120. In the embodiment of FIG. 1B, the MEMS element including the diaphragm 130 and the backplate 135 are mounted to the base 105, and in the embodiment of FIG. 1C, the MEMS element is mounted to the cover 120.

To allow the diaphragm to move with respect to the backplate 135, the outside environment is in communication with the back volume 140. That is, air particles can flow through the backplate 135. Traditionally, the backplate 135 includes holes or other means for air to flow through the backplate 135. Such a configuration, however, may introduce some problems.

For example, viscous losses (or backplate losses) can be caused by air particles that strike the diaphragm 130. The interactions between the air particles and the diaphragm 130 can move the diaphragm 130 in relation to the backplate 135. The motion of the diaphragm 130 causes air to pass through the holes in the backplate 135. The passing air heats the backplate 135 via friction, thereby losing energy. Thus, random air particles that hit the diaphragm 130 can cause heat in the backplate 135 and induce energy losses, which induce noise into the MEMS microphone.

As described in greater detail below, in various embodiments described herein there is no backplate 135 with holes that allows air to pass through the holes. Thus, there is no friction and corresponding heat generated by air passing through the backplate 135. Accordingly, various embodiments do not have viscous losses similar to those of traditional MEMS microphones.

In traditional MEMS microphones, the larger that the back volume 140 is, the better the sound quality of the MEMS microphones is. However, with the miniaturization of devices such as smartphones and tablets, the size of the MEMS microphones has been trending smaller (e.g., with smaller back volumes 140), but ideally the sound quality produced by the MEMS microphones should stay the same or even improve. As expected, it is increasingly difficult to improve quality while miniaturizing the size of the microphone (e.g., reducing the back volume 140).

Reducing the back volume 140 in traditional MEMS microphones (e.g., as in the embodiments shown in FIGS. 1A and 1C) increases thermal boundary layer losses. As noted above with respect to viscous losses, random air particles strike the diaphragm 130 and cause the diaphragm to move. Movement of the diaphragm 130 causes energy to transfer into the back volume 140. The back volume 140 loses energy to the cover, which is a heat sink (e.g., an isothermal boundary condition). The heat is transferred from the cover 120 to ambient air and, therefore, is lost. Thus, thermal boundary layer losses are energy losses, and energy losses generate noise in the MEMS microphone.

As described in greater detail below, in various embodiments described herein, reduced air pressure within a MEMS element virtually increases the back volume. At lower air pressures, the density of air molecules is reduced, thereby reducing thermal boundary layer losses. Accordingly, various embodiments do not have thermal boundary layer losses similar to those of traditional MEMS microphones.

Some traditional MEMS microphones use a constant charge across the diaphragm 130 and the backplate 135. That is, the charge across the capacitor formed by the diaphragm 130 and the backplate 135 does not change during use. In such a configuration, the change in voltage is proportional to the change in the gap between the diaphragm 130 and the backplate 135. Thus, the change in voltage can be used to sense the acoustic energy. However, such a configuration has a non-linear relationship between the force required to move the diaphragm 130 in relation to the backplate 135 and the gap between the diaphragm 130 and the backplate 135. The following formula shows the non-linear relationship:

$$F_e \propto \text{gap}^{-2}$$

where $F_e$ is the electrostatic force between the diaphragm 130 and the backplate 135, and gap is the distance between the diaphragm 130 and the backplate 135. To correct for the non-linear relationship, various signal processing techniques can be used such as companders (e.g., compressors and expanders). However, the more signal processing that is required, the more power the microphone consumes and more noise is introduced into the signals. Also, with more signal processing, more logic gates are used to implement the processing, which increases the size of the microphone.

Figure 2A:
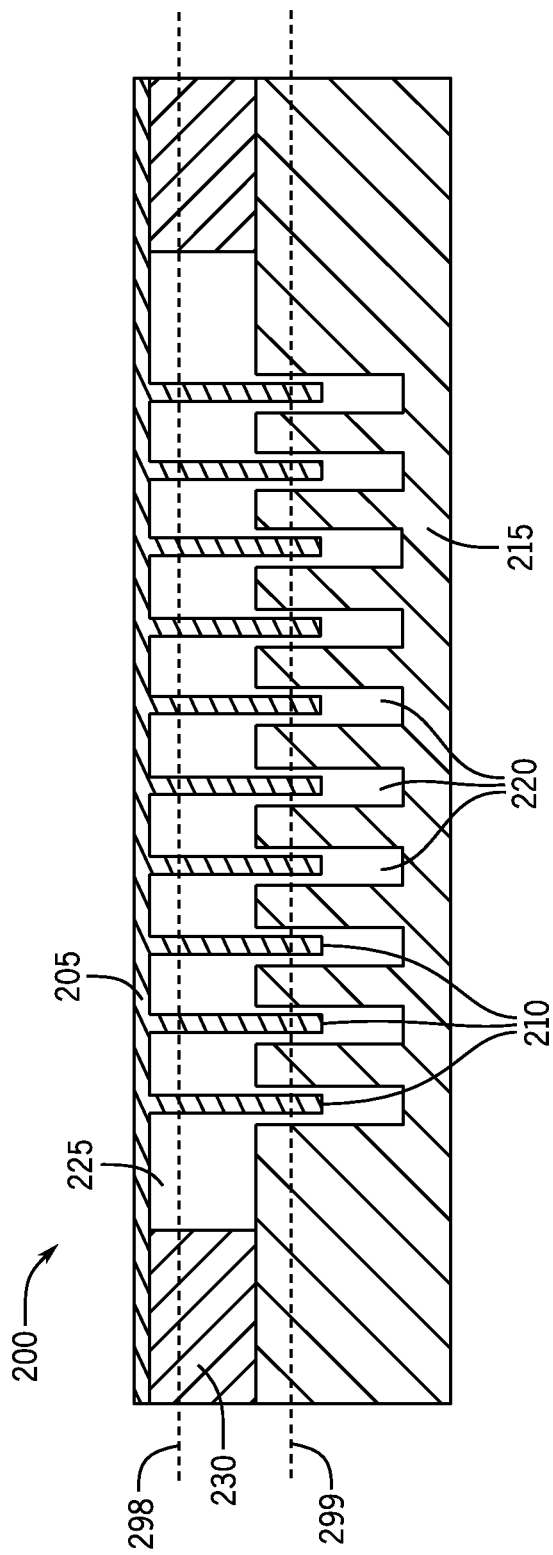

FIGS. 2A-2C are cross-sectional diagrams of a low-pressure MEMS acoustic element in accordance with an illustrative embodiment. An illustrative MEMS element 200 includes a diaphragm 205, a backplate 215, and an insulator 230. The diaphragm 205 includes multiple fingers 210. The backplate 215 includes voids 220. In an illustrative embodiment, the MEMS element 200 is a "low-pressure" MEMS element in that an inside volume of the MEMS element 200 is at a pressure lower than an atmospheric pressure (e.g., a vacuum pressure). In alternative embodiments, additional, fewer, and/or different elements may be used.

In the embodiment illustrated in FIG. 2, the backplate 215 is rigid and acoustic energy does not cause the backplate 215 to move. In an illustrative embodiment, the backplate 215 can be mounted to another device such as another substrate or circuit board. The diaphragm 205 is flexible and can move with respect to the backplate 215 when the environmental air pressure changes (e.g., via acoustic energy). The backplate 215 and the diaphragm 205 are electrically conductive, and a capacitance between the backplate 215 and the diaphragm 205 can be used to detect acoustic energy. The insulator 230 is not electrically conductive.

FIGS. 2A-2C illustrate the MEMS element 200 with different environmental pressures. FIG. 2A illustrates the MEMS element 200 with a neutral environmental pressure. FIG. 2B illustrates the MEMS element 200 with a positive environmental pressure. FIG. 2C illustrates the MEMS element 200 with a negative environmental pressure. As illustrated by FIGS. 2A-2C, acoustic energy causes the diaphragm 205 to move in and out based on the environmental pressure. That is, the acoustic energy changes the environmental pressure as sensed by the MEMS element 200. The movement of the diaphragm 205 shown in FIGS. 2A-2C is meant to be illustrative only and not meant to be limiting with respect to proportions or dimensions.

As the diaphragm 205 moves in and out with respect to the backplate 215, the fingers 210 move in and out of the voids 220. The capacitance between the diaphragm 205 and the backplate 215 is primarily determined based on the overlap of the fingers 210 with the backplate 215. That is, the further that the fingers 210 extend into the voids 220 thereby increasing the overlap of the fingers 210 with the backplate 215, the greater the capacitance. Similarly, the less that the fingers 210 extend into the voids 220 thereby decreasing the overlap of the fingers 210 with the backplate 215, the less the capacitance. Although there is some capacitance between the portion of the diaphragm 205 that the fingers 210 are attached to (e.g., the portion spanning across the insulator 230) and the backplate 215, such a capacitance is negligible compared to the capacitance between the fingers 210 and the backplate 215. Accordingly, the capacitance between the diaphragm 205 and the backplate 215 in FIG. 2B is greater than the capacitance in FIG. 2C.

In an illustrative embodiment, the MEMS element 200 can be used with a constant voltage across the diaphragm 205 and the backplate 215. Such a configuration contrasts with the configuration discussed above with respect to the MEMS microphone 100 of FIGS. 1A-1C because the voltage is constant in the MEMS element 200 and the charge changes, whereas the voltage changes in the MEMS microphone 100 and the charge is constant.

In an embodiment in which a constant voltage is used across the diaphragm 205 and the backplate 215, the change in charge is proportional to the change in area of the capacitor formed by the diaphragm 205 and the backplate 215. The area of the capacitor is primarily determined by the amount of overlap between the fingers 210 and the backplate 215. Thus, the change in charge can be used to sense acoustic energy. Such a configuration has a linear relationship between the force required to move the diaphragm 205 in relation to the backplate 215 and the area of the capacitor formed by the diaphragm 205 and the backplate 215. The following formula shows the linear relationship:

$$F_e \propto \text{area}$$

where $F_e$ is the electrostatic force between the diaphragm 205 and the backplate 215, and area is the area of the capacitor formed by the diaphragm 205 and the backplate 215. Because of the linear relationship between the area of the capacitor and the electrostatic force, the change in capacitance is linearly proportional to the change in the charge of the capacitor if there is a constant voltage across the capacitor. Thus, the change in charge can be monitored to determine a movement of the diaphragm 205 with respect to the backplate 215. In some embodiments, a charge amplifier is used during signal processing.

As discussed above with reference to the MEMS microphone 100 of FIGS. 1A-1C, noise can be introduced into the electrical signal from the MEMS microphone 100 by air particles interacting with the surface of the diaphragm 130. In the MEMS microphone 100, both sides of the diaphragm 130 are exposed to air. That is, air interacts with the diaphragm 130 from the environment side (e.g., via the acoustic port 110) and from the back volume 140.

In an illustrative embodiment, the volume 225 between the diaphragm 205 and the backplate 215 can have a low pressure compared to the environmental air pressure. For example, the volume 225 may be under vacuum. By evacuating some or all of the air in the volume 225, fewer air particles interact with the surface of the diaphragm 205, thereby reducing noise.

In an illustrative embodiment, the position of the diaphragm 205 can be adjusted based on the environmental pressure. For example, at sea level, the diaphragm 205 can be in a neutral position, as in FIG. 2A. However, if the MEMS element 200 is transported to a location above sea level (or any other location with a lower environmental air pressure), the diaphragm 205 will move away from the backplate 215 if the absolute pressure within the volume 225 is constant, such as in the embodiment of FIG. 2C. Similarly, if the MEMS element 200 is transported to a location below sea level (or any other location with a higher environmental air pressure), the diaphragm 205 will move closer to the backplate 215 if the absolute pressure within the volume 225 is constant, such as the embodiment of FIG. 2B. To compensate for the difference in the position of the diaphragm 205 with respect to the backplate 215 under neutral conditions (e.g., no change in environmental pressure), the position of the diaphragm 205 can be adjusted such that the diaphragm 205 is in a neutral position (e.g., as in FIG. 2A).

Any suitable means can be used to measure and compensate for changes in environmental pressure. For example, in an illustrative embodiment, a bias voltage can be applied across the diaphragm 205 and the backplate 215, thereby applying an electrostatic force between the diaphragm 205 and the backplate 215. The electrostatic force from the bias voltage can be used to force the diaphragm 205 and the backplate 215 closer together to compensate for a change in ambient pressure. In an illustrative embodiment, the capacitance between the diaphragm 205 and the backplate 215 can be determined by an ASIC, and the ASIC can adjust the bias voltage to bring the capacitance to a pre-determined capacitance. For example, the ASIC can determine an average capacitance over a pre-determined time period. The ASIC can determine if the average capacitance during the pre-determined time period corresponds to a time period during which no (or minimal) acoustic energy was applied to the diaphragm 205. The average capacitance during the pre-determined time period can be compared to a pre-determined capacitance corresponding to, for example, a neutral diaphragm 205 position. The bias voltage can be adjusted such that the average capacitance during a next pre-determined time period is (or is closer to) the pre-determined capacitance.

In some embodiments, the MEMS element 200 can be used as a pressure sensor. For example, the MEMS element 200 can be used to determine an absolute ambient pressure. As discussed above with respect to FIGS. 2A and 2B, the diaphragm 205 moves in or out depending upon ambient pressure. Accordingly, the capacitance between the diaphragm 205 and the backplate 215 changes. In an illustrative embodiment, the capacitance between the diaphragm 205 and the backplate 215 can be used to determine an ambient pressure. For example, a capacitance between the diaphragm 205 and the backplate 215 can be used to look up a corresponding ambient pressure in a look-up table. In another example, a mathematical relationship between the capacitance and the ambient pressure can be determined. In such an example, the mathematical relationship may be determined, at least in part, based on the characteristics of the MEMS element 200, such as the number of fingers 210, the amount of movement of the diaphragm 205, etc.

As noted above, the capacitance between the diaphragm 205 and the backplate 215 changes significantly with slight changes in air pressure, such as those caused by sound waves. In an illustrative embodiment, an average capacitance over time (e.g., 0.1 second, 0.5 seconds, 1 second, 5 seconds, etc.) can be used to determine the ambient pressure. Over time, changes caused by sound waves will cancel out. Thus, using an average capacitance over time is representative of the ambient air pressure without sound waves.

As discussed above, in some embodiments, a bias voltage is used to compensate for changes in ambient pressure. In such embodiments, the amount of voltage used to bring the capacitance between the diaphragm 205 and the 215 to the pre-determined capacitance can be used to determine the ambient pressure. For example, the amount of bias voltage can be compared to a look-up table to determine the ambient pressure.

FIG. 3 is a cross-sectional diagram of a low-pressure MEMS acoustic element along line 299 of FIG. 2A in accordance with an illustrative embodiment. In the embodiment shown in FIG. 3, the diaphragm 205 includes thirty-four fingers 210. In alternative embodiments, additional or fewer fingers 210 can be used. For example, the diaphragm 210 can include about 140,000, 175,000, or 210,000 fingers 210 in a square millimeter. In such an example, the fingers 210 can be 0.5, 0.8, 1, 1.2, or 1.5 micrometers (µm) wide. Any other suitable number or size of fingers 210 can be used. For example, the diaphragm 210 can include less than 140,000 fingers 210 or greater than 210,000 fingers 210. In another example, the fingers can be less than 0.5 µm or greater than 1.5 µm wide.

In the embodiment shown in FIG. 3, the fingers 210 have a cross-sectional shape of a square or rectangle. In alternative embodiments, any suitable shape can be used, such a circular, elliptical, hexagonal, octagonal, a pentagram, etc.

Also as shown in FIG. 3, the cross-sectional shape of the voids 220 matches the shape of the fingers 210. That is, the voids 220 are square or rectangular, but have a larger area such that the fingers 210 do not touch and short-circuit to the backplate 215. In alternative embodiments, the cross-sectional shape of the voids 220 can differ from the cross-sectional shape of the fingers 210.

In various embodiments, the diaphragm 205 moves about 0.001, 0.005, 0.01, 0.05, 0.1, 0.5, or 1 nanometer per Pascal (nm/Pa). In alternative embodiments, the diaphragm 205 can move less than 0.001 nm/Pa or greater than 1 nm/Pa. In various embodiments the width of the fingers is 0.1, 0.5, 1.0, 1.5, 2.0, 2.5, 5, or 10 micrometers (µm). In alternative embodiments, the width of the fingers may be less than 0.1 µm or greater than 10 µm. In various embodiments, the distance between the end of the fingers 210 and the bottom of the voids 220 is 1, 2, 3, 4, 5, 10, or 20 micrometers (µm). In alternative embodiments, the distance between the end of the fingers 210 and the bottom of the voids 220 may be less than 1 µm or greater than 20 µm. In various embodiments, the length of overlap between the fingers 210 and the substrate 215 is 1, 2, 3, 4, 5, 10, or 20 micrometers (µm). In alternative embodiments, the length of overlap between the fingers 210 and the substrate 215 may be less than 1 µm or greater than 20 µm. In various embodiments, the depth of the voids 220 is 1, 2, 3, 4, 5, 10, 15, 20, or 30 micrometers (µm). In alternative embodiments, the depth of the voids 220 is less than 1 µm or greater than 20 µm.

In the embodiment shown in FIG. 3, the cross-sectional shape of the backplate 215 is rectangular. In alternative embodiments, any suitable shape can be used. For example, the cross-sectional shape of the backplate 215 can be square, circular, elliptical, hexagonal, octagonal, a pentagram, etc. By altering the cross-sectional shapes of the fingers 210 and/or the voids 220, the capacitance between the backplate 215 and the diaphragm 205 can be altered. That is, by increasing the surface area between a finger 210 and a respective void 220, the capacitance between the backplate 210 and the diaphragm 205 is increased.

FIG. 4 is a cross-sectional diagram of a low-pressure MEMS acoustic element along line 298 of FIG. 2A in accordance with an illustrative embodiment. In the embodiment shown in FIG. 4, the insulator 230 surrounds the fingers 210 around an outer perimeter of the MEMS element 200. In an illustrative embodiment, the insulator 230 creates a seal between the diaphragm 205 and the backplate 215 such that the volume 235 can have a different pressure than the environmental pressure.

FIGS. 5A-5F are diagrams illustrating a method of producing a low-pressure MEMS acoustic element in accordance with an illustrative embodiment. FIG. 6 is a flow chart of a method of producing a low-pressure MEMS acoustic element in accordance with the embodiment illustrated in FIGS. 5A-5F. In alternative embodiments, additional, fewer, and/or different steps may be performed. Also, FIGS. 5A-5F and 6 are not meant to be limiting with respect to the order of operations. For example, in alternative embodiments, two or more operations can be performed simultaneously.

Figure 5A:
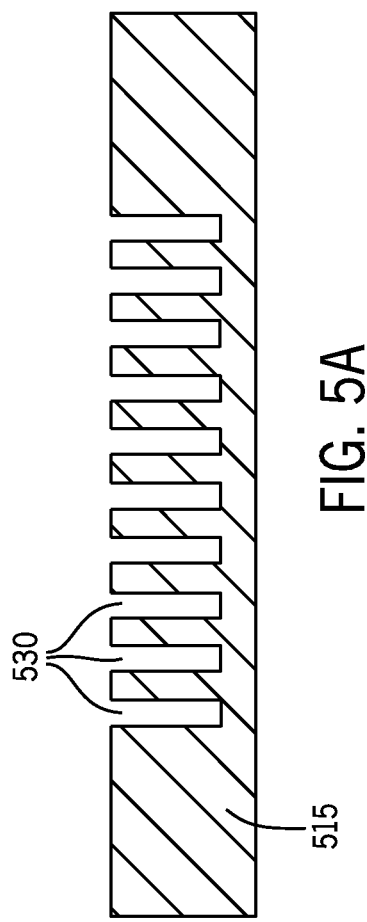
Figure 6:
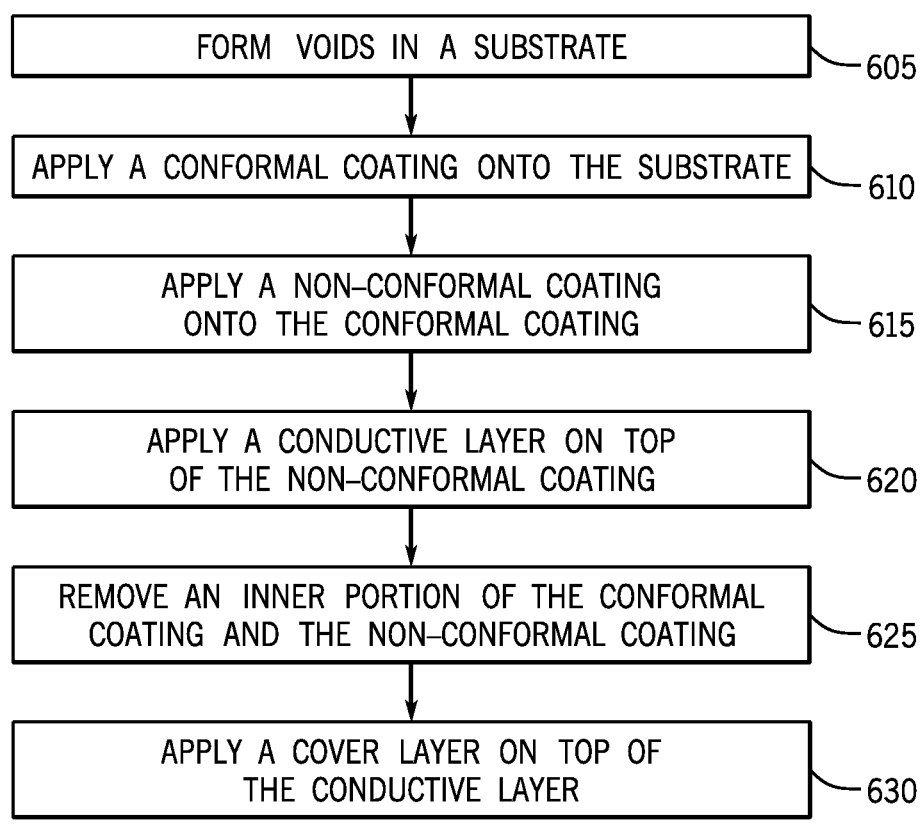
FIG. 6 is a flow chart of a method of producing a low-pressure MEMS acoustic element in accordance with an illustrative embodiment.

FIG. 5A includes a substrate 515. The substrate 515 can be an electrically conductive material, such as the material of the backplate 215. The substrate 515 includes voids 530. In an operation 605, the voids 530 can be formed in the substrate 515. The voids 530 can be formed within the substrate 515 using any suitable method, such as etching (e.g., deep reactive-ion etching), laser drilling, mechanical circular drilling, stamping, etc.

Figure 5B:
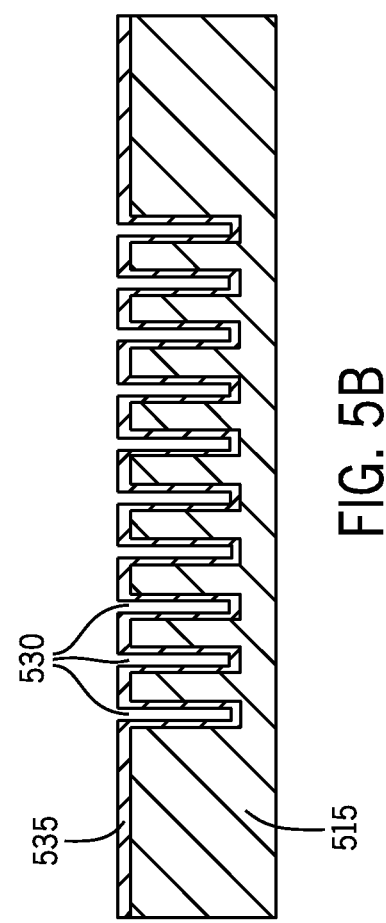

In an operation 610, a conformal coating 535 can be applied to the upper surface of the substrate 515, as shown in FIG. 5B. The conformal coating 535 can cover the top surface of the substrate 515 and the inner surface of the voids 530. The conformal coating 535 can be deposited using any suitable method, such as plasma-enhanced chemical vapor deposition (PECVD). In an operation 615, a non-conformal coating 540 can be applied to the upper surface of the conformal coating 535, as shown in FIG. 5C. The non-conformal coating 540 can be applied to the top surface of the conformal coating and the bottom of the voids 530, but not the sides of the voids 530. Any suitable method can be used to apply the non-conformal coating 540.

In an operation 620, a conductive layer 545 can be applied on top of the non-conformal coating 540, as shown in FIG. 5D. The conductive layer 545 can be any suitable material, such as the material of the diaphragm 205. For example, the conductive layer 545 can be poly silicon. The conductive layer 545 can include fingers 510 filling the voids 530 between the conformal coating 535. The fingers 510 can correspond to the fingers 210 of the MEMS element 200.

As shown in FIG. 5D, the conductive layer 545 can include voids 550. In an operation 625, an inner portion of the conformal coating 535 and the non-conformal coating 540 can be removed, as shown in FIG. 5E. The inner portion of the conformal coating 535 and the non-conformal coating 540 can be removed using any suitable method, such as wet etching using dilute hydrogen fluoride (HF). For example, an etching material can flow through the voids 550 to dissolve or otherwise liquefy the inner portion of the conformal coating 535 and the non-conformal coating 540. As shown in FIG. 5E, an outer portion of the conformal coating 535 and the non-conformal coating 540 can remain, thereby forming the insulator 230 of the MEMS element 200.

In an operation 630, a cover layer 555 can be applied over the conductive layer 545, as shown in FIG. 5F. In an illustrative embodiment, the cover layer 555 is formed under low pressure (e.g., vacuum or negative gauge pressure at sea level). For example, the cover layer 555 can be formed after low pressure is applied within a vacuum chamber that contains the substrate 515, the non-conformal coating 540, the conductive layer 545, etc. The cover layer 555 can be applied in any suitable manner, such as low-pressure chemical vapor deposition (LPCVD) or ultra-high vacuum chemical vapor deposition (UHV/CVD). The cover layer 555 can seal the volume 525 such that the volume 525 has a low pressure compared to atmospheric pressure. For example, the pressure within the volume 525 can be about ten millibar. In alternative embodiments, the pressure within the volume 525 can be higher or lower than ten millibar.

FIGS. 7A-7G are diagrams illustrating a method of producing a low-pressure MEMS acoustic element in accordance with an illustrative embodiment. FIG. 8 is a flow chart of a method of producing a low-pressure MEMS acoustic element in accordance with the embodiment illustrated in FIGS. 7A-7G. FIGS. 7A-7G and 8 are similar to FIGS. 5A-5F and 6, respectively, but with a provision for using a bias voltage for compensating for changes in ambient pressure. In alternative embodiments, additional, fewer, and/or different steps may be performed. Also, FIGS. 7A-7G and 8 are not meant to be limiting with respect to the order of operations. For example, in alternative embodiments, two or more operations can be performed simultaneously.

FIG. 7A includes a substrate 715. The substrate 715 can be an electrically conductive material, such as the material of the backplate 215. The substrate 715 includes voids 730. In an operation 805, the voids 730 can be formed in the substrate 715. The voids 730 can be formed within the substrate 715 using any suitable method, such as etching (e.g., deep reactive-ion etching), laser drilling, mechanical circular drilling, stamping, etc.

In an operation 810, a conformal coating 735 can be applied to the upper surface of the substrate 715, as shown in FIG. 7B. The conformal coating 735 can cover the top surface of the substrate 715 and the inner surface of the voids 730. The conformal coating 735 can be deposited using any suitable method, such as plasma-enhanced chemical vapor deposition (PECVD). In an operation 815, a non-conformal coating 740 can be applied to the upper surface of the conformal coating 735, as shown in FIG. 7C. The non-conformal coating 740 can be applied to the top surface of the conformal coating and the bottom of the voids 730 thick enough to fill the voids 730 with enough material such that the top surface of the non-conformal coating 740 in the voids 730 is above the top surface of the substrate 715. Any suitable method can be used to apply the non-conformal coating 740.

In an operation 820, a conductive layer 745 can be applied on top of the non-conformal coating 740, as shown in FIG. 7D. The conductive layer 745 can be any suitable material, such as the material of the diaphragm 205. For example, the conductive layer 745 can be poly silicon. The conductive layer 745 can include fingers 710 that do not extend into the voids 730. The fingers 710 can correspond to the fingers 210 of the MEMS element 200.

As shown in FIG. 7D, the conductive layer 745 can include voids 750. In an operation 825, an inner portion of the conformal coating 735 and the non-conformal coating 740 can be removed, as shown in FIG. 7E. The inner portion of the conformal coating 735 and the non-conformal coating 740 can be removed using any suitable method, such as wet etching using dilute hydrogen fluoride (HF). For example, an etching material can flow through the voids 750 to dissolve or otherwise liquefy the inner portion of the conformal coating 735 and the non-conformal coating 740. As shown in FIG. 7E, an outer portion of the conformal coating 735 and the non-conformal coating 740 can remain, thereby forming the insulator 230 of the MEMS element 200.

In an operation 830, a cover layer 755 can be applied over the conductive layer 745, as shown in FIG. 7F. In an illustrative embodiment, the cover layer 755 is formed under low pressure (e.g., vacuum). The cover layer 755 can be applied in any suitable manner, such as low-pressure chemical vapor deposition (LPCVD) or ultra-high vacuum chemical vapor deposition (UHV/CVD). The cover layer 755 can seal the volume 725 such that the volume 725 has a low pressure compared to atmospheric pressure. For example, the pressure within the volume 725 can be about ten millibar. In alternative embodiments, the pressure within the volume 725 can be higher or lower than ten millibar. In an illustrative embodiment, the cover layer 755 is non-conductive.

Figure 7G:
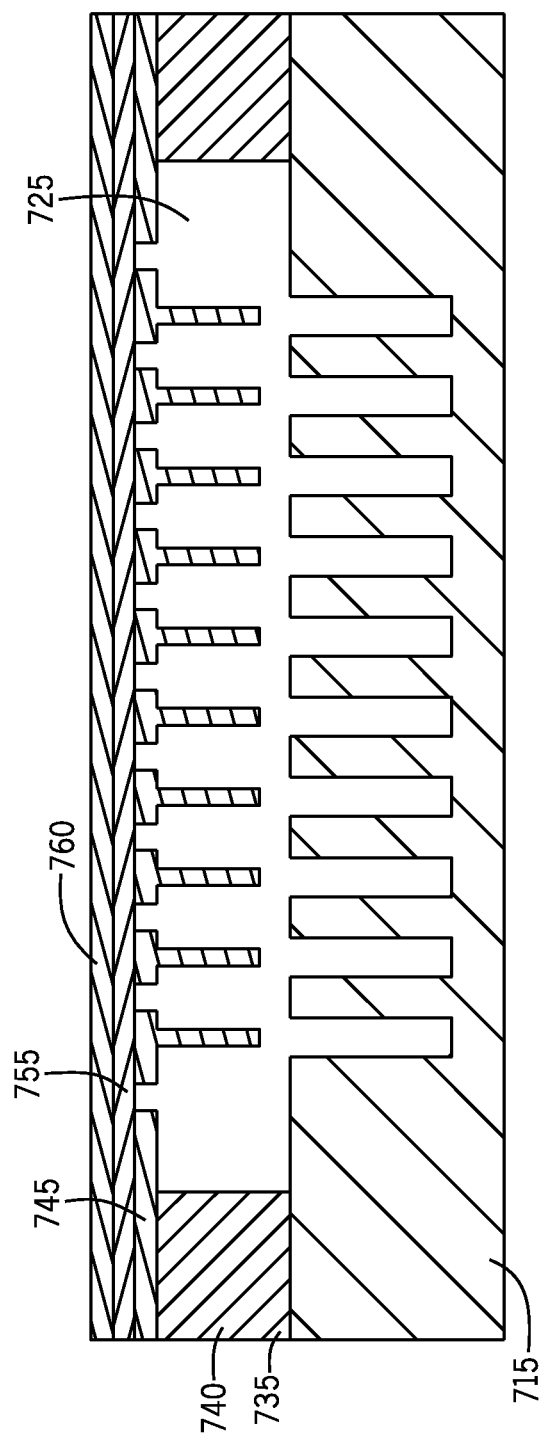
Figure 8:
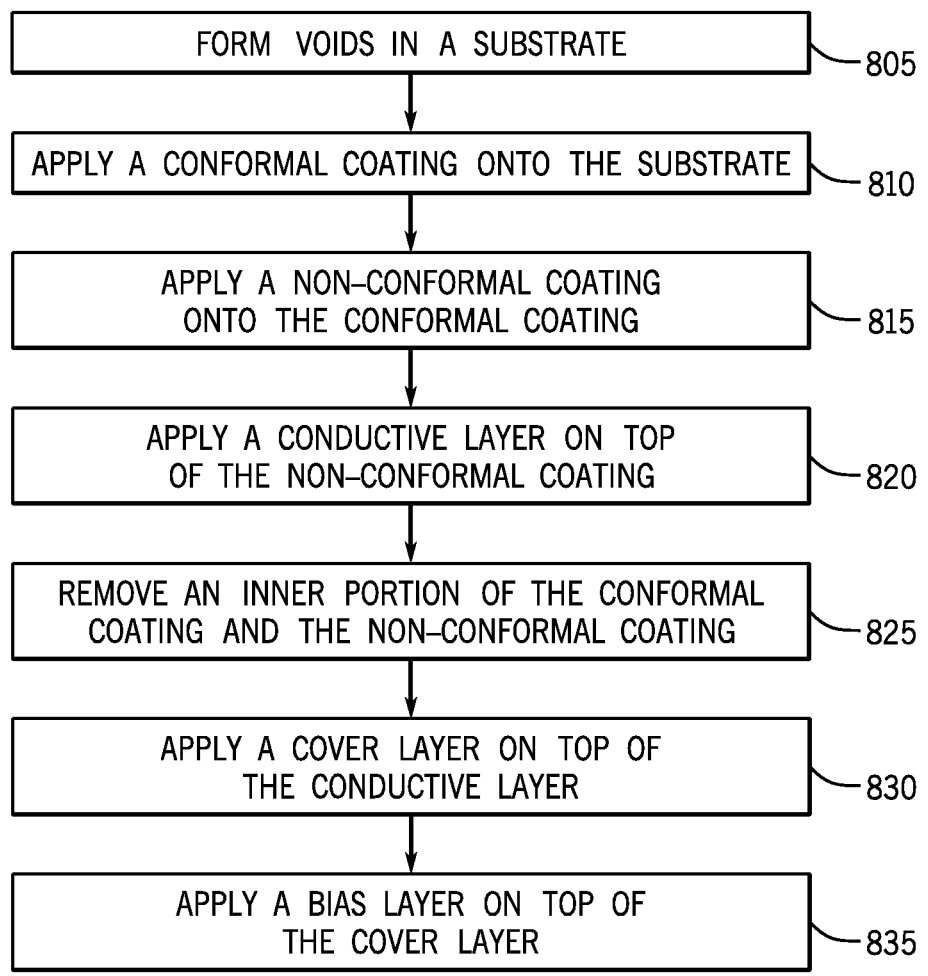
FIG. 8 is a flow chart of a method of producing a low-pressure MEMS acoustic element in accordance with an illustrative embodiment.

In an operation 835, a bias layer 760 can be applied over the cover layer 755, as shown in FIG. 7G. In an illustrative embodiment, the bias layer 760 can be conductive. For example, the bias layer 760 can be the same material as the conductive layer 745. As discussed above, a bias voltage can be applied across the bias layer 760 and the substrate 715, thereby forming a capacitor. The electrostatic force created by the bias voltage can be used to move the conductive layer 745 (along with the cover layer 755 and the bias layer 760) in or out of the volume 725.

For example, at a neutral ambient pressure, the conductive layer 745 may be straight across the MEMS element as shown by the diaphragm 205 of FIG. 2A. When the ambient pressure is decreased, the conductive layer 745 may move away from the volume 725 and the substrate 715, as shown by the diaphragm 205 of FIG. 2C. A bias voltage may be applied or adjusted across the bias layer 760 and the substrate 715. The electrostatic force generated by the bias voltage may bring the conductive layer 745 back to a straight position, as shown by the diaphragm 205 of FIG. 2A. In an illustrative embodiment, the air pressure within the volume 725 is set such that the diaphragm 205 is in a neutral position at a minimum operating ambient pressure, such as the ambient air pressure at sea level. In embodiments in which the MEMS element is to be used at ambient pressure greater than the ambient air pressure at sea level, the air pressure within the volume 725 can be a pressure that allows the diaphragm 205 to be in the neutral position at (or above) the greater ambient pressure.

As seen in FIGS. 7D-7G, the fingers 710 do not extend into their respective voids 730. In an illustrative embodiment, the diaphragm of the MEMS element can be adjusted using the bias voltage such that the fingers 710 do extend into respective voids 730 during normal operation. In alternative embodiments, the fingers 710 may extend into voids 730, as in the embodiment shown in FIGS. 5D-5F.

FIGS. 9A-9L are diagrams illustrating a method of producing a low-pressure MEMS acoustic element in accordance with an illustrative embodiment. FIG. 10 is a flow chart of a method of producing a low-pressure MEMS acoustic element in accordance with the embodiment illustrated in FIGS. 9A-9L. In alternative embodiments, additional, fewer, and/or different steps may be performed. Also, FIGS. 9A-9L and 10 are not meant to be limiting with respect to the order of operations. For example, in alternative embodiments, two or more operations can be performed simultaneously.

As shown in FIGS. 9A and 10, in an operation 1005, a conformal coating 940 is deposited over a substrate 915. In various embodiments, the conformal coating 940 is an oxide layer that is approximately 8, 10, 11, 13, 15, or 20 μm thick. In alternative embodiments, the conformal coating 940 can be any other suitable thickness, such as less than 8 μm thick or greater than 20 μm thick. In an illustrative embodiment, the substrate 915 corresponds to the backplate 215. In some embodiments, the substrate 915 can be formed on top of electrical or electronic components. For example, the substrate 915 can be formed on top of or over an ASIC, thereby forming a single component that includes the MEMS element and the processing circuitry.

As shown in FIGS. 9B and 10, in an operation 1010, a first conductive layer 945 is deposited over the conformal coating 940. The first conductive layer 945 can be any suitable material, such as the material of the diaphragm 205. For example, the first conductive layer 945 can be poly silicon. In various embodiments, the first conductive layer 945 is approximately 0.5, 0.8, 1, 1.2, or 1.5 μm thick. In alternative embodiments, the first conductive layer 945 is any other suitable thickness, such as less than 0.5 μm or greater than 1.5 μm thick.

As shown in FIGS. 9C and 10, in an operation 1015, trenches 930 can be formed in the first conductive layer 945, the conformal coating 940, and the substrate 915. The trenches 930 do not pass entirely through the substrate 915. In an illustrative embodiment, the trenches 930 correspond to the voids 220. Any suitable method for forming the trenches 930 can be used. For example, a deep oxide etch can be used to form the trenches 930. In various embodiments, the trenches 930 can be approximately 10, 13, or 16 μm deep. In alternative embodiments, the trenches 930 can have any other suitable depth, such as less than 10 μm or greater than 16 μm deep.

As shown in FIGS. 9D and 10, in an operation 1020, the trenches 930 can be filed. In an illustrative embodiment, the trenches 930 are filled with an oxide. For example, the trench-fill material 935 can be the same material as the conformal coating 940. In an illustrative embodiment, high-density plasma (HDP) and/or chemical vapor deposition followed by chemical-mechanical planarization (CMP) can be used. The trenches 930 can be filled such that the top of the trench-fill material 935 is flush with the top of the first conductive layer 945 (e.g., via CMP).

As shown in FIGS. 9E and 10, in an operation 1025, trenches 975 can be formed in the first conductive layer 945 and the conformal coating 940. The trenches 975 can have a center axis that is co-axial with a center axis of the trenches 930. In an illustrative embodiment, a deep oxide etch can be used to form the trenches 975. In various embodiments, the trenches 975 are approximately 5, 5.5, 6, 6.5, or 7 μm deep. In alternative embodiments, the trenches 975 can be any suitable depth, such as less than 5 μm or greater than 7 μm deep. As shown in FIGS. 9F and 10, in an operation 1025, fingers 910 can be formed in the trenches 975. In an illustrative embodiment, the fingers 910 correspond to the fingers 210. The fingers 910 can be formed by filling the trenches 930 with a conductive material (e.g., the conductive material of the first conductive layer 945). The top side of the fingers 910 can be flush with the top side of the first conductive layer 945.

As shown in FIGS. 9G and 10, in an operation 1030, release holes 950 are formed in the first conductive layer 945. The release holes 950 are aligned in the first conductive layer 945 such that the release holes 950 are not formed where there are fingers 910. In various embodiments, the release holes 950 are approximately 1, 1.5, 1.8, 2, 2.2, 2.5, or 3 μm in diameter. In alternative embodiments, the release holes 950 can be any suitable diameter, such as less than 1 μm or greater than 3 μm.

As shown in FIGS. 9H and 10, in an operation 1035, a cover layer 955 is deposited over the release holes 950 in the first conductive layer 945. The cover layer 955 can fill the release holes 950. In various embodiments, the cover layer 955 can be approximately 10, 12, 15, 20, 25, 30, 35, 36, or 40 nanometers (nm) thick. In alternative embodiments, the cover layer 955 can be any suitable thickness, such as less than 10 nm or greater than 40 nm. The cover layer 955 can be deposited on top of the top surface of the first conductive layer 945. As shown in FIG. 9H, the cover layer 955 does not extend to the outer perimeter of the first conductive layer 945.

As shown in FIGS. 9I and 10, in an operation 1040, a non-conductive layer 960 is formed onto the cover layer 955. In an illustrative embodiment, the non-conductive layer 960 is patterned onto the cover layer 955 and has release holes. In the embodiment shown in FIG. 9I, the release holes in the non-conductive layer 960 are aligned with the fingers 910. In alternative embodiments, the release holes are arranged so that the release holes in the non-conductive layer 960 are not aligned with the release holes 950 in the first conductive layer 945. The non-conductive layer 960 is also formed on the top of the first conductive layer 945 along an outside perimeter of the first conductive layer 945 (e.g., around the cover layer 955). In an illustrative embodiment, the non-conductive layer 960 is a silicon nitride. In various embodiments, the non-conductive layer 960 is approximately 0.5, 0.8, 1, 1.2, or 1.5 μm thick over the cover layer 955. In alternative embodiments, the non-conductive layer 960 can be any suitable thickness, such as less than 0.5 µm or greater than 1.5 µm.

As shown in FIGS. 9J and 10, in an operation 1045, a volume 925 is formed between the fingers 910 and the substrate 915. In an illustrative embodiment, the volume 925 is formed by removing the trench-fill material 935, the cover layer 955, and a portion of the conformal coating 940 through the release holes 950 in the first conductive layer 945 and the release holes in the non-conductive layer 960. For example, the material between the substrate 915 and the non-conductive layer 960, except for the first conductive layer 945 and the fingers 910, are etched and transferred out of the volume 925 through the release holes 950 and the release holes in the non-conductive layer 960.

Figure 9K:
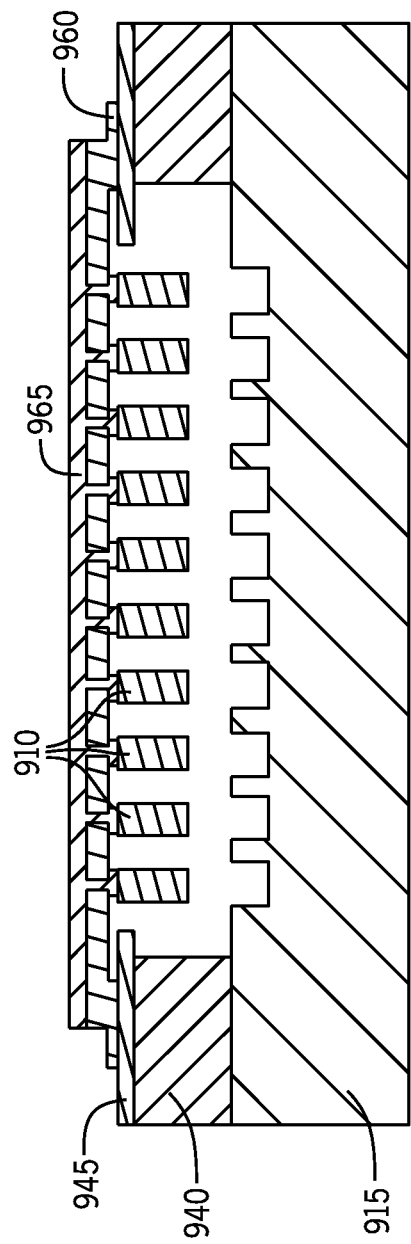
Figure 10:
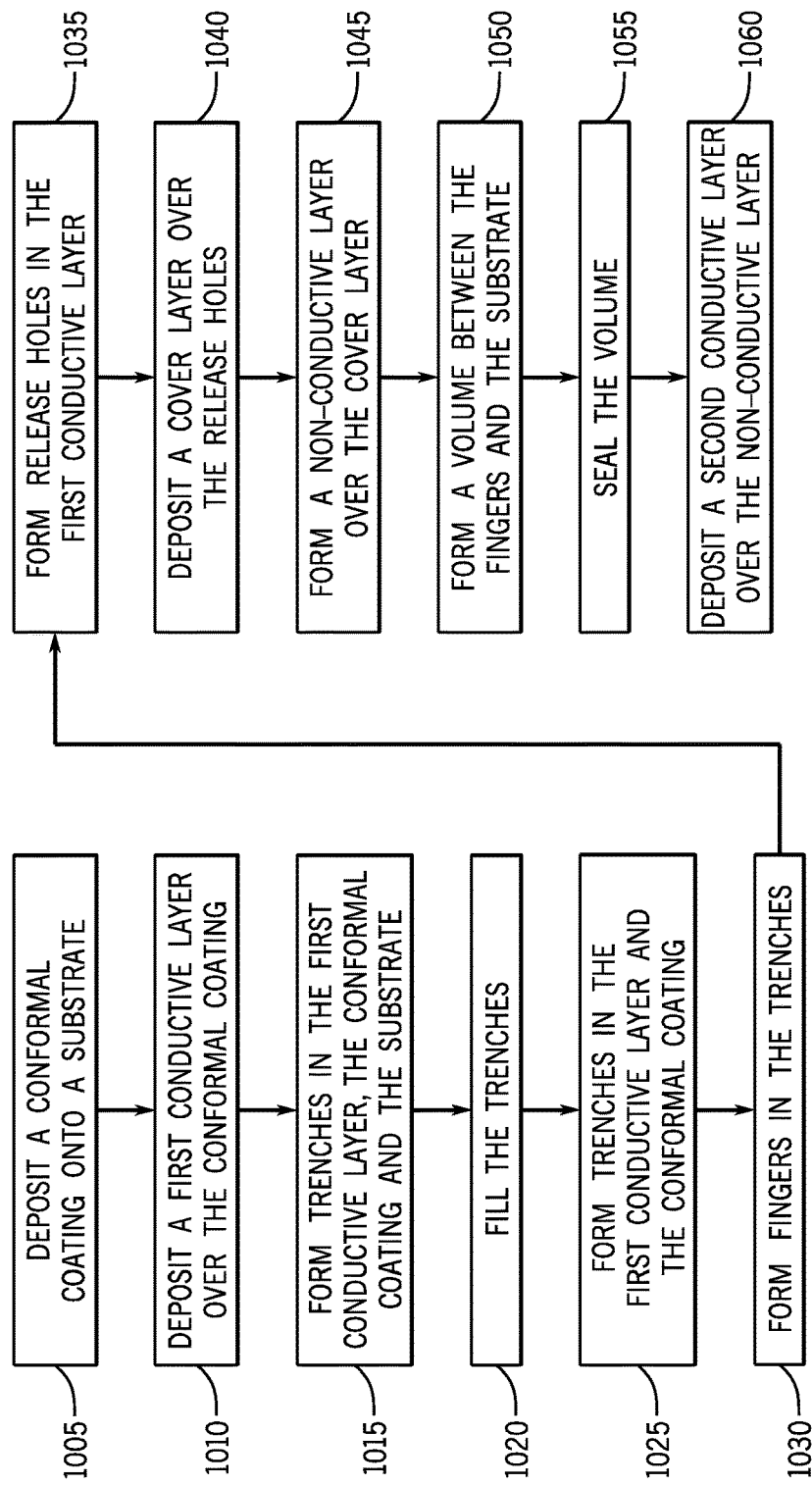
FIG. 10 is a flow chart of a method of producing a low-pressure MEMS acoustic element in accordance with an illustrative embodiment.

As shown in FIGS. 9K and 10, in an operation 1050, the volume 925 is sealed. A non-conductive sealant 965 is deposited on top of the non-conductive layer 960. As shown in FIG. 9K, the sealant 965 may flow through the release holes in the non-conductive layer 960 and may partially coat the first conductive layer 945. In alternative embodiments, the sealant 965 is deposited such that as little sealant 965 as possible passes through the release holes in the non-conductive layer 960 while adhering the first conductive layer 945 to the non-conductive layer 960. In yet other embodiments, more sealant 965 than is shown in FIG. 9K passes through the release holes in the non-conductive layer 960. As shown in FIG. 9K, the sealant 965 fills the release holes in the non-conductive layer 960 to form an air-tight seal for the volume 925. In an illustrative embodiment, the sealant 965 is applied while under low pressure such that when the volume 925 is sealed, the pressure inside the volume 925 is less than an ambient pressure at sea level. For example, the sealant can be applied while the pressure within the volume 925 is approximately 75-100 milli Torr (i.e., approximately 10-14 Pascals). In an illustrative embodiment, the sealant 965 is formed via low-pressure chemical vapor deposition (LPCVD). The sealant 965 covers at least a portion of the top surface of the non-conductive layer 960.

Figure 9L:
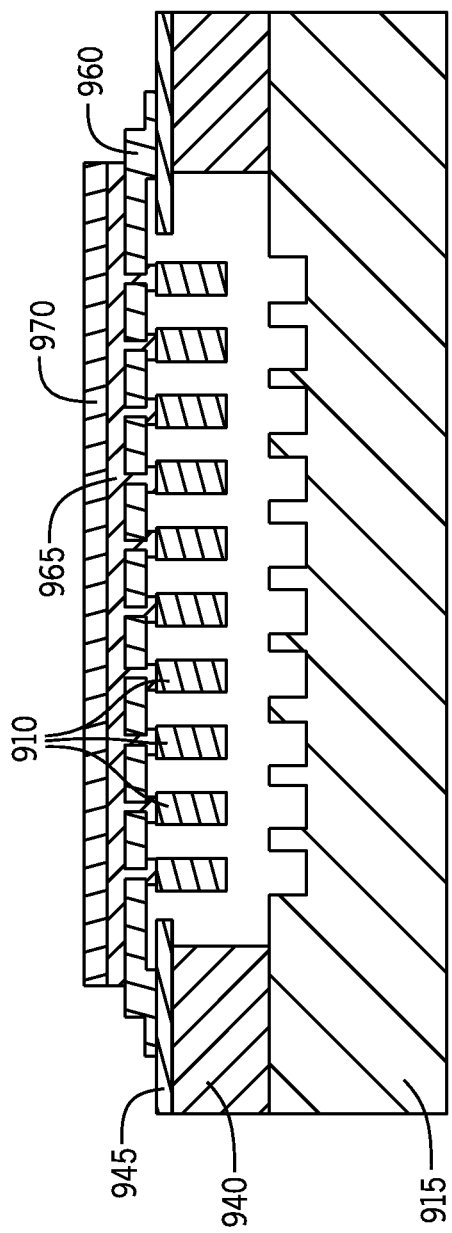

As shown in FIGS. 9L and 10, in an operation 1055, a second conductive layer 970 is deposited over the non-conductive layer 960 (e.g., over the sealant 965). The second conductive layer 970 is connected to the first conductive layer 945 via the sealant 965 and/or the non-conductive layer 960 such that the first conductive layer 945 and the second conductive layer 970 move together as a diaphragm (e.g., the diaphragm 210). The second conductive layer 970 can be used as a control electrode to adjust the position of the first conductive layer 945. As discussed above, an electrostatic force between the second conductive layer 970 and the substrate 915 can be adjusted such that the first conductive layer 945 is in a neutral position.

Figure 11:
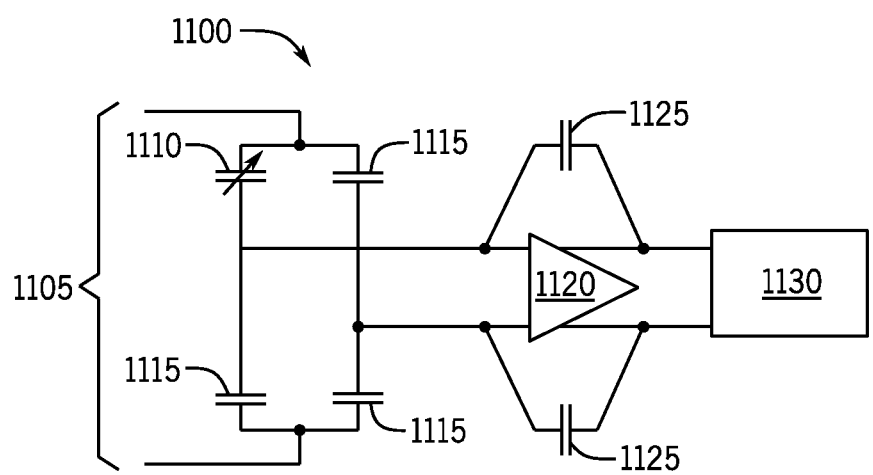
FIG. 11 is a circuit diagram for converting acoustic energy into an electrical signal in accordance with an illustrative embodiment.

FIG. 11 is a circuit diagram for converting acoustic energy into an electrical signal in accordance with an illustrative embodiment. A circuit 1100 includes an input signal 1105, a MEMS element 1110, capacitors 1115, a differential charge amplifier 1120, feedback capacitors 1125, and a demodulator 1130. In alternative embodiments, additional, fewer, and/or different elements may be used. Also, in alternative embodiments, any suitable circuit can be used.

In an illustrative embodiment, the input signal 1105 includes a high-frequency carrier signal. The MEMS element 1110 can be the MEMS element 200 of FIGS. 2A-2C. A constant voltage can be applied across the MEMS element 1110 (e.g., across the diaphragm 205 and the backplate 215). The capacitors 1115 can be matching capacitors (e.g., have the same capacitance). In an illustrative embodiment, the capacitors 1115 have a capacitance that matches the capacitance of the MEMS element 1110 in a neutral position (e.g., the position shown in FIG. 2A). The MEMS element 1110 and the capacitors 1115 are arranged in a Wheatstone bridge. The signal from the Wheatstone bridge is input into the differential charge amplifier 1120. The feedback capacitors 1125 can be sized for gain matching. The signal output from the differential charge amplifier 1120 can be input into the demodulator 1130, which can demodulate the signal from the differential charge amplifier 1120 to obtain an electrical signal indicative of an acoustic energy applied to the MEMS element 1110.

In traditional MEMS microphones, a first stage amplifier is used to amplify the signal from the MEMS element. The first stage amplifier has a flicker noise, which is a physical limitation of the amplifier. The noise is most dominant in low frequencies, such as up to about 1,000 Hz. Flicker noise can be eliminated using the circuit 1100 by modulating to higher frequencies (e.g., higher than 300,000 Hz) before the first amplification stage, and demodulating back to original or acoustic frequencies later in the signal chain. For example, the input signal 1105 can be a high-frequency carrier signal. The high-frequency carrier can have a frequency of, for example, 100,000 Hz to 1,000,000 Hz (i.e., 1 MHz). The demodulator 1130 can demodulate the signal by removing the high-frequency carrier, leaving the acoustic signal from the MEMS element 1110.

Figure 12A:
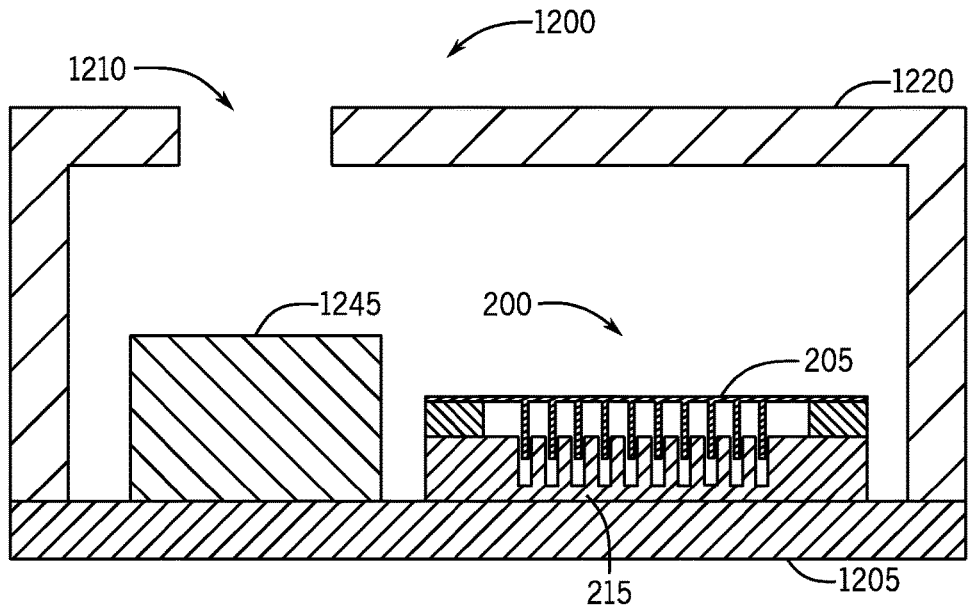
FIGS. 12A and 12B are cross-sectional diagrams of top-port MEMS microphones with a low-pressure MEMS acoustic element in accordance with illustrative embodiments.

FIG. 12A is a cross-sectional diagram of a MEMS microphone with a low-pressure MEMS acoustic element in accordance with an illustrative embodiment. The MEMS microphone 1200 includes a MEMS element 200, a base 1205, an application-specific integrated circuit (ASIC) 1245, a cover 1220, and an acoustic port 1210 in the cover 1220. In alternative embodiments, additional, fewer, and/or different elements may be used.

The MEMS microphone 1200 of FIGS. 12A (and 12B) is a top-port microphone in that the MEMS microphone 1200 may be mounted to another device (e.g., a printed circuit board) at the base 1205. In alternative embodiments, the MEMS microphone 1200 may be mounted as a bottom-port microphone by mounting the MEMS microphone 1200 to another device at the cover 1220. In such embodiments, the other device can include an acoustic port in fluid communication with the acoustic port 1210.

In the embodiment illustrated in FIG. 12A, the MEMS element 200 is mounted to the base 1205. The MEMS element 200 is offset from the acoustic port 1210 to prevent or inhibit dust or debris from entering into the MEMS microphone 1200 and obscuring the MEMS element 200. In alternative embodiments, the MEMS element 200 may be mounted in any suitable position. For example, the MEMS element 200 may be mounted to the cover 1220 in a manner that does not obscure the acoustic port 1210.

Figure 12B:
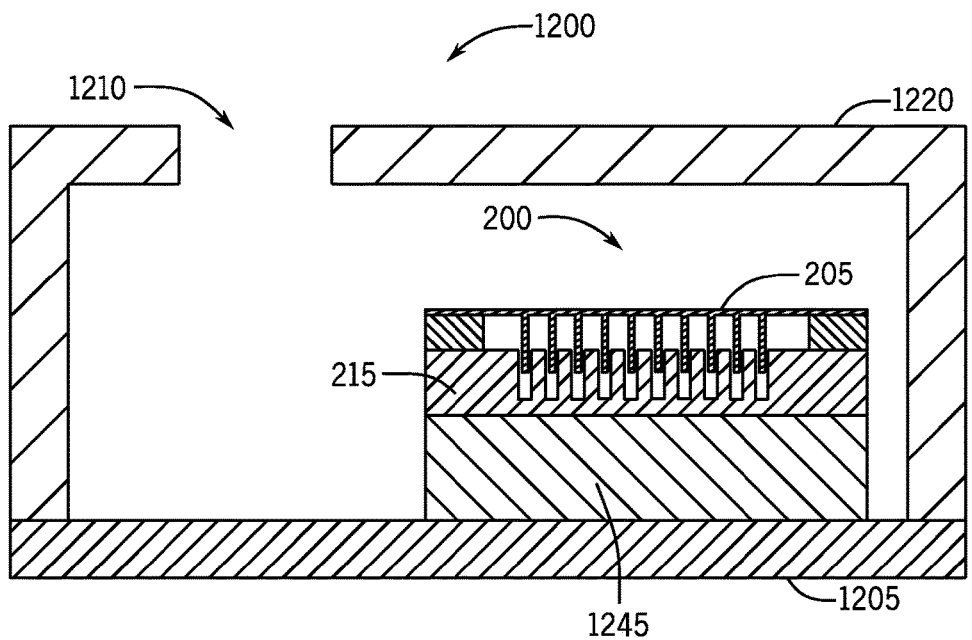

FIG. 12B is a cross-sectional diagram of a top-port MEMS microphone with a low-pressure MEMS acoustic element in accordance with an illustrative embodiment. The MEMS microphone 1200 of FIG. 12A is similar to the MEMS microphone 1200 of FIG. 12B except that the MEMS element 200 is mounted (or formed) on top of the ASIC 1245. For example, the substrate 915 of the MEMS element in FIG. 9L can be formed on top of the ASIC 1245. In such an embodiment, the first conductive layer 945 and the second conductive layer 970 can be each electrically connected to the ASIC 1245 via either wire bonds or through vias in the substrate 915. By integrating the ASIC 1245 with the MEMS element, manufacturing may be simplified and costs reduced because the ASIC 1245 and the MEMS element can be manufactured simultaneously and do not need to be assembled together later.

Figure 13A:
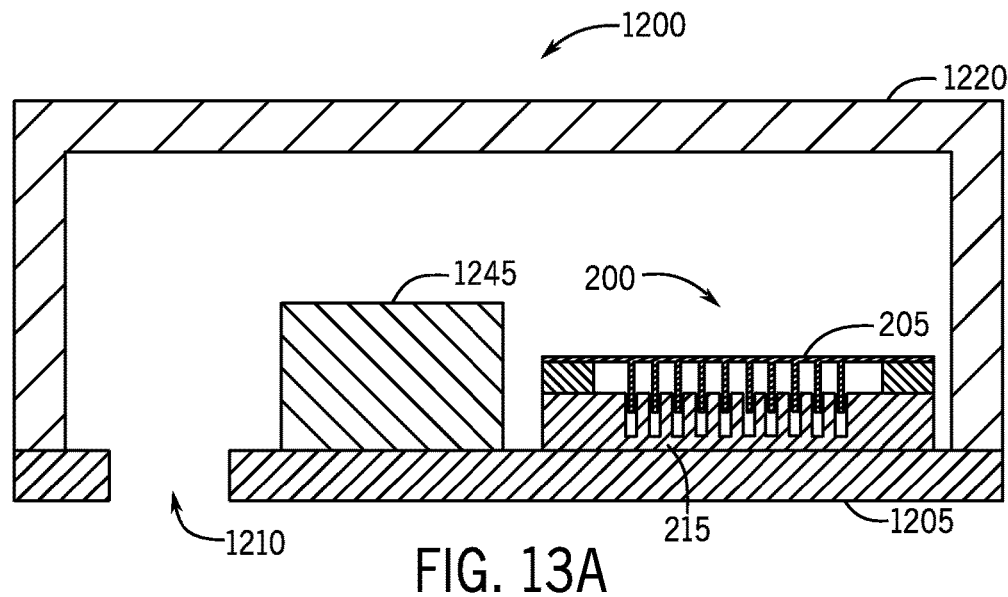
FIGS. 13A and 13B are cross-sectional diagrams of bottom-port MEMS microphones with a low pressure-MEMS acoustic element in accordance with illustrative embodiments.
Figure 13B:
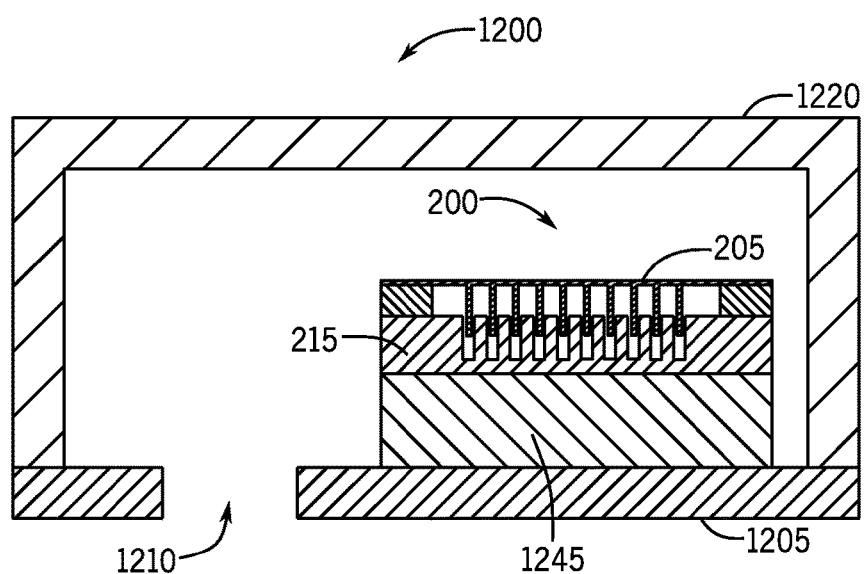

FIGS. 13A and 13B are cross-sectional diagrams of bottom-port MEMS microphones with a low-pressure MEMS acoustic element in accordance with illustrative embodiments. FIGS. 13A and 13B are similar to FIGS. 12A and 12B, respectively, except for the location of the acoustic port 1210. In FIGS. 12A and 12B, the acoustic port 1210 is in the cover 1220. In the embodiments illustrated in FIGS. 13A and 13B, the acoustic port 1210 is in the base 1205. In an illustrative embodiment, electrical contacts for an external circuit board can be located on the bottom side of the base 1205. In such embodiments, the external circuit board can have an acoustic port corresponding to the acoustic port 1210 to allow acoustic energy to pass through the external circuit board and through the acoustic port 1210.

Although FIGS. 12A, 12B, 13A, and 13B illustrate the use of one MEMS element 200 per MEMS microphone 1200, in alternative embodiments, any suitable number of MEMS elements 200 may be used. For example, in some embodiments, one MEMS element 200 may be used to sense acoustic energy and another MEMS element 200 may be used to determine an ambient pressure. In another example, multiple MEMS elements 200 may be used to provide redundancy, backup, verification, etc.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical system comprising:
   a diaphragm with a first surface and a second surface, wherein the first surface is exposed to an environmental pressure, and wherein the second surface comprises a plurality of fingers extending from the second surface;
   a backplate comprising a plurality of voids, wherein each of the plurality of fingers extends into a respective one of the plurality of voids; and
   an insulator between a portion of the diaphragm and a portion of the backplate; and
   an inside volume defined at least in part by the diaphragm, the backplate, and the insulator;
   wherein a pressure of the inside volume is less than the environmental pressure; and wherein the diaphragm is configured to move with respect to the backplate in response to changes in the environmental pressure.

2. The microelectromechanical system of claim 1, wherein the changes in the environmental pressure include changes caused by acoustic energy.

3. The microelectromechanical system of claim 1, wherein the plurality of fingers do not touch the backplate.

4. The microelectromechanical system of claim 1, wherein movement of the diaphragm with respect to the backplate causes a change in capacitance between the diaphragm and the backplate.

5. The microelectromechanical system of claim 4, wherein the change in capacitance between the diaphragm and the backplate is proportional to an amount of acoustic energy.

6. The microelectromechanical system of claim 1, wherein the diaphragm and the backplate are each electrically conductive, and wherein the insulator is electrically insulative.

7. The microelectromechanical system of claim 1, wherein movement of the diaphragm with respect to the backplate causes a change in an overlap between the plurality of fingers and the backplate.

8. The microelectromechanical system of claim 1, wherein the inside volume is sealed by the diaphragm, the backplate, and the insulator to form a vacuum.

9. The microelectromechanical system of claim 1, wherein the pressure of the inside volume has a negative gauge pressure.

10. A microelectromechanical system (MEMS) microphone package comprising:
    a substrate;
    a MEMS transducer disposed on the substrate and comprising:
        a diaphragm having a first surface and a second surface, wherein the first surface is exposed to an environmental pressure, and wherein the second surface comprises a plurality of fingers extending from the second surface;
        a backplate having a plurality of voids, wherein each of the plurality of fingers extends into one of the plurality of voids; and
        an insulator between a portion of the diaphragm and a portion of the backplate, wherein the diaphragm is configured to move with respect to the backplate in response to changes in the environmental pressure;
    a processing circuit operatively coupled to the MEMS transducer and configured to:
        apply a constant voltage across the diaphragm and the insulator; and
        generate an electrical signal based on a capacitance between the diaphragm and the backplate, wherein the electrical signal is representative of the changes in the environmental pressure; and
    a cover coupled to the substrate and structured to cover the MEMS transducer and processing circuit.

11. The MEMS microphone package of claim 10, wherein the processing circuit comprises three matching capacitors coupled to the MEMS transducer to form a Wheatstone bridge.

12. The MEMS microphone package of claim 11, wherein the processing circuit is configured to apply an alternating current carrier signal across the Wheatstone bridge.

13. The MEMS microphone package of claim 12, wherein the processing circuit further comprises a differential charge amplifier configured to amplify changes in the carrier signal.

14. The MEMS microphone package of claim 13, wherein the changes in the carrier signal are caused by the capacitance between the diaphragm and the insulator.

15. The MEMS microphone package of claim 10, wherein the capacitance between the diaphragm and the backplate is proportional to an amount of acoustic energy.

16. The MEMS microphone package of claim 10, wherein movement of the diaphragm with respect to the backplate causes a change in an overlap between the plurality of fingers and the backplate.

17. The MEMS microphone package of claim 10, further comprising an inside volume defined at least in part by the diaphragm, the backplate, and the insulator, wherein a pressure of the inside volume is less than the environmental pressure.

18. The MEMS microphone package of claim 17, wherein the pressure of the inside volume is lower than an ambient pressure.

19. The MEMS microphone package of claim 10, wherein the changes in the environmental pressure are caused by acoustic energy, and wherein the electrical signal is representative of the acoustic energy.

20. The MEMS microphone package of claim 10, wherein the diaphragm and the backplate are each electrically conductive, and wherein the insulator is electrically insulative.

* * * * *